United States Patent [19]
Schoenborn et al.

[11] Patent Number: 5,290,396
[45] Date of Patent: Mar. 1, 1994

[54] TRENCH PLANARIZATION TECHNIQUES

[75] Inventors: Philippe Schoenborn, San Jose; Nicholas F. Pasch, Pacifica, both of Calif.

[73] Assignee: LSI Logic Corporation, Milpitas, Calif.

[21] Appl. No.: 711,624

[22] Filed: Jun. 6, 1991

[51] Int. Cl.$^5$ .......................................... H01L 21/00
[52] U.S. Cl. .................................. 156/636; 156/645; 156/649; 156/657; 437/67; 437/228
[58] Field of Search .............. 156/636, 657, 653, 648, 156/649, 645; 437/67, 228, 62, 69

[56] References Cited

U.S. PATENT DOCUMENTS

| | | | |
|---|---|---|---|
| 4,019,248 | 4/1977 | Black | 29/583 |
| 4,473,598 | 9/1984 | Ephrath et al. | 427/86 |
| 4,490,209 | 12/1984 | Hartman | 156/643 |
| 4,493,142 | 1/1985 | Hwang | 29/575 |
| 4,609,809 | 9/1986 | Yamaguchi et al. | 219/121 |
| 4,758,306 | 7/1988 | Cronin et al. | 156/643 |
| 4,851,097 | 7/1989 | Hattori et al. | 204/192.33 |
| 4,876,217 | 10/1989 | Zdebel | 437/67 |
| 4,948,742 | 8/1990 | Nishimura et al. | 437/67 X |
| 4,980,019 | 12/1990 | Baerg et al. | 156/643 |
| 4,980,311 | 12/1990 | Namose | 437/67 |
| 5,006,482 | 4/1991 | Kerbaugh et al. | 437/67 |
| 5,011,788 | 4/1991 | Kawaji et al. | 437/67 |
| 5,015,602 | 5/1991 | Van Der Plas et al. | 437/67 |
| 5,091,289 | 2/1992 | Cronin et al. | 430/312 |
| 5,091,330 | 2/1992 | Cambou et al. | 437/62 |
| 5,102,822 | 4/1992 | Calligaro | 437/67 |
| 5,104,482 | 4/1992 | Monkowski et al. | 156/643 |
| 5,142,828 | 9/1992 | Curry, II | 51/281 R |

FOREIGN PATENT DOCUMENTS

| | | | |
|---|---|---|---|
| 0113517 | 7/1984 | European Pat. Off. | 21/32 |
| 0375632 | 6/1990 | European Pat. Off. | 21/76 |
| 58-67023 | 4/1983 | Japan . | |
| 59-108325(A) | 6/1984 | Japan | 21/76 |
| 62-125629(A) | 6/1987 | Japan | 21/76 |
| 60-260455 | 11/1987 | Japan | 21/302 |
| 1-235245(A) | 9/1989 | Japan | 21/76 |
| 3-151635(A) | 11/1989 | Japan | 21/302 |

OTHER PUBLICATIONS

Thin Film Processes, by Vossen et al, pp. 497–521, 1978.

Primary Examiner—Thi Dang
Attorney, Agent, or Firm—Gerald E. Linden; Michael D. Rostoker

[57] ABSTRACT

Various techniques for quantifying polishing performance are disclosed, and provide insight on the progression from a planarization regime to a smoothing regime to a blanket polish back regime, as well as providing a single, definable parameter (Quality Characteristic) for optimizing polishing performance. With these analytical tools in hand, it is possible to create novel structures which absorb polish rate non-uniformities across a wafer, and it is also possible to define and employ a "quick" polish step to clear high spots which will be followed by a subsequent etch step for rapid removal of material.

9 Claims, 13 Drawing Sheets

OUTSIDE 8μm TRENCH

OUTSIDE 1.144 mm TRENCH

INSIDE 8μm TRENCH

INSIDE 60μm TRENCH

INSIDE 1.144 mm TRENCH

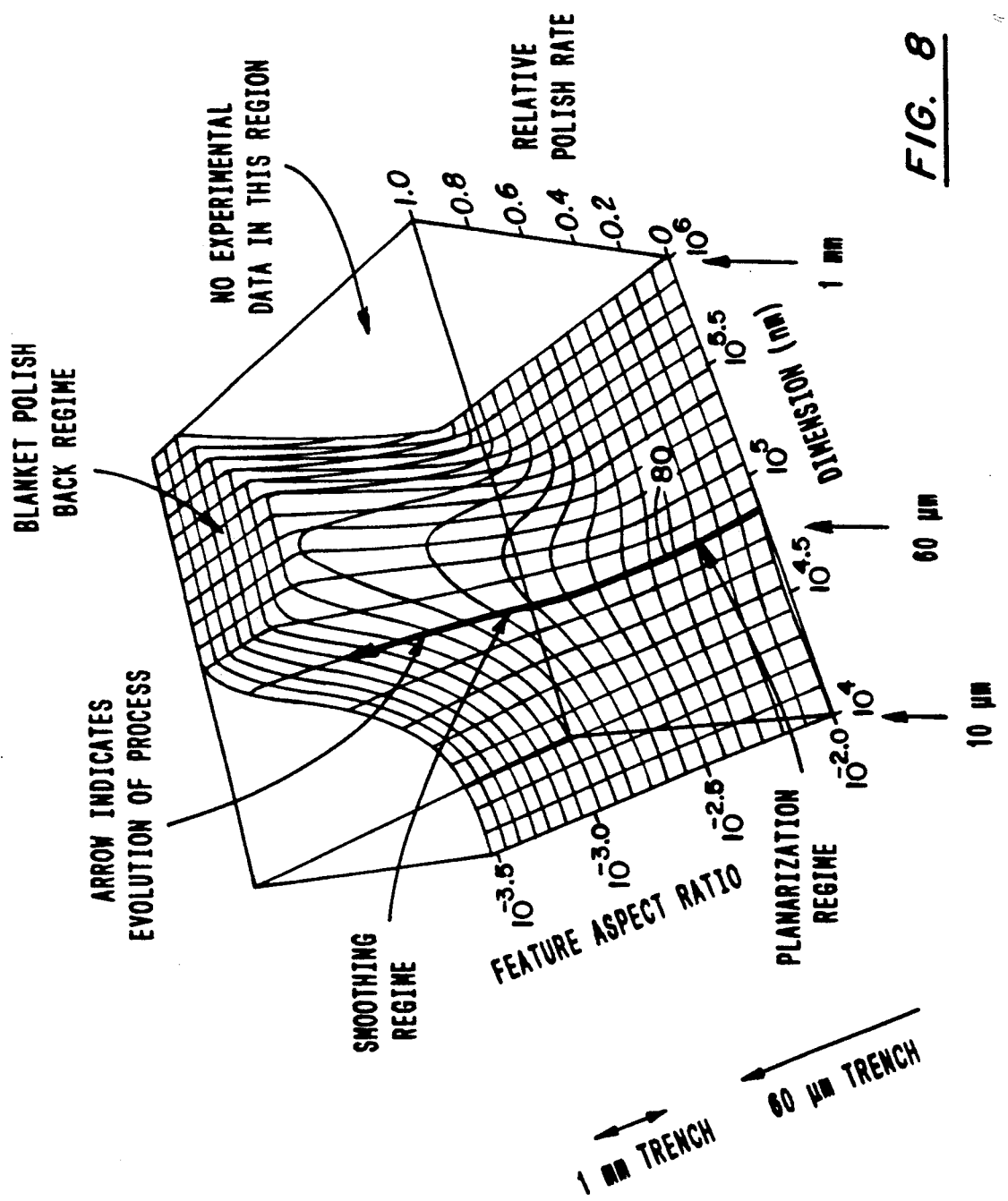

| WAFER # | MINIMUM | MAXIMUM | THICKNESS INSIDE TRENCH | | TOLERANCE | | |
|---|---|---|---|---|---|---|---|
| | | | MEAN | STD DEV | 10% QUALITY | 5% QUALITY | 3% QUALITY | 1% QUALITY |
| 8  | 275 | 487 | 422.589 | 52.221 | -55 | -50  | -63  | -324  |
| 3  | 232 | 474 | 405.865 | 63.022 | -55 | -42  | -34  | -31   |
| 13 | 229 | 410 | 413.576 | 71.393 | -59 | -48  | -46  | -127  |
| 15 | 170 | 412 | 346.901 | 60.354 | -72 | -111 | -226 | -1770 |
| 16 | 176 | 405 | 343.924 | 60.150 | -74 | -119 | -249 | -1974 |
| 12 | 177 | 412 | 341.755 | 58.282 | -75 | -125 | -265 | -2128 |

TABLE 1

THICKNESSES IN NANOMETERS (nm)
WAFERS # 15, 16, & 12 DID NOT HAVE A NITRIDE CAP LAYER

FIG. 18

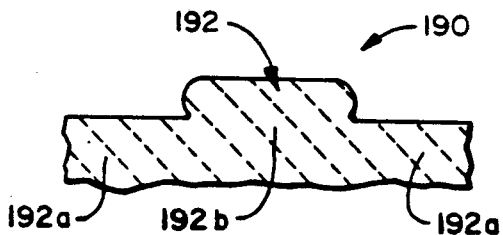 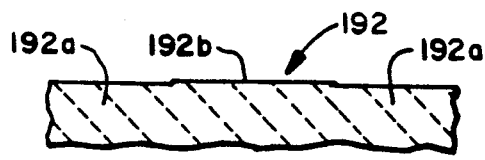
FIG. 19A　　　　　　FIG. 19B
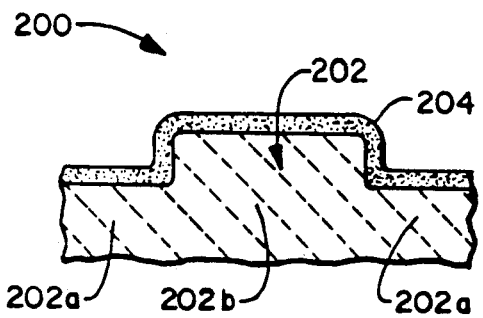 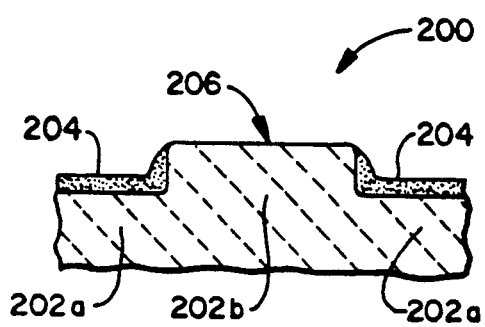
FIG. 20A　　　　　　FIG. 20B
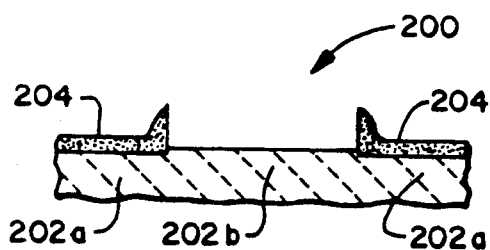 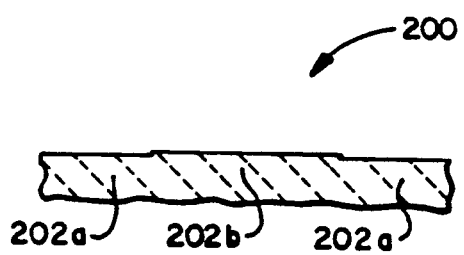
FIG. 20C　　　　　　FIG. 20D

1

TRENCH PLANARIZATION TECHNIQUES

TECHNICAL FIELD OF THE INVENTION

The present invention relates to planarization techniques for semiconductor devices, more particularly to the planarization of irregular topographies resulting (e.g.) from the creation of isolation regions adjacent to active regions, wherein the isolation and active regions have dissimilar heights, creating an irregular top surface topography for the (in-process) device being fabricated.

BACKGROUND OF THE INVENTION

Electrical isolation of semiconductor integrated transistors from one another can be achieved by laterally (in the plane of the wafer) isolating "active" regions of the device with insulating material. Two techniques are common: 1) selectively oxidizing wafer silicon surrounding the active region (known as "LOCOS", or Local Oxidation of Silicon), or 2) depositing insulating material, such as silicon oxide around the active region. In the latter, it is known to form "trenches" around the active region, and to fill the trenches with oxide. This is referred to as Recessed Oxide Isolation (ROI). The oxide-filled trenches extend into the substrate to a depth of from a few hundred Angstroms (Å) to a few microns ($\mu$m). One such technique involves filling the trenches with Low-Temperature Oxide (LTO). In the main hereinafter, techniques of planarizing trenches, such as those filled with LTO, are discussed.

FIG. 1 shows a semiconductor device 10, at an intermediate fabrication stage. A substrate 12 has had trenches 14 (one trench illustrated) etched into its otherwise planar top surface, and the trenches 14 surround active, doped regions 16 (two active regions illustrated) of the semiconductor device. Since the active regions 16 are more elevated than the trenches 14, they are sometimes referred to as "islands".

In the process of forming the trenches 14, typically a patterned trench mask layer 18, of a relatively hard material such as silicon nitride, will have been applied with openings allowing for the etching of the trenches. As illustrated, the trench mask material 18 covers the islands 16, and the openings in the trench mask are vertically aligned with the trenches 14. In order to fill the trenches 14, an insulating material 20, such as silicon dioxide, is blanket deposited over the entire trench mask, and overfills the trenches, thereby creating an irregular top surface topography having a trough 22. For purposes of the discussion that follows, the trough 22 can be considered to be a trench in the layer 20. The excess insulating material 20 overlying the active regions 16 must be removed, and in the process of removing same, it is advantageous to planarize the trenches 14 so that the trench-fill material 20 is flush with the diffusion regions 16. (The mask 18 will be stripped away to allow for further fabrication steps.) FIG. 1 shows the semiconductor device 10 at this stage of fabrication—ready to have the excess trench-fill material 20 removed, and preferably planarized.

It is often desirable to smooth, or planarize, the top surface of the device after the insulating layer has been applied, prior to further process steps which may include various levels of metallization. In some cases, polishing techniques are employed to remove excess material over the island areas, leaving either a thin, planarized insulating layer (20), or leaving insulating material only in the trenches (14). In the latter case, the trench mask 18 conveniently acts as an polishing stop, since it (e.g., nitride) typically is much harder than the material being removed (e.g., oxide).

FIG. 2 shows the semiconductor device 10 of FIG. 1, after planarization. It can easily be seen that isolation oxide 20 remains only in the trenches 14 between active regions 16.

It should be undertood that additional process steps, other than those described above, may be employed in the fabrication of trench isolation structures, such as creating an ion-implanted layer and an adhesion layer in the trench. These additional steps are not particularly germane to the present invention, and are omitted from further discussion for the sake of clarity.

A problem with planarization (by polishing) of trench structures, unaddressed by the prior art and of considerable importance, is that depending upon the size of a trench (e.g., 22), trench-fill material (e.g., oxide) may be "prematurely" removed from inside the trench, which would defeat the purpose of planarization. In other words, it is antithetical to planarization to have material being removed from within the trench at the same time that material without the trench is being removed.

FIGS. 3 and 4 graphically illustrate this point. As shown, a semiconductor device 30 includes a substrate 32 with trenches 34a and 34b formed therein, resulting in "islands" 36a, 36b and 36c between adjacent trenches. The trenches 34a and 34b are overfilled with oxide 38. As expected, the top surface of the blanket oxide 38 exhibits an irregular topography, following (to some extent) the topography of the trenched substrate, with commensurate troughs 40 and 42. The problem of planarizing trenches, i.e. avoiding prematurely gouging the trench bottom, is exacerbated when there are trenches having different sizes, namely different widths. (In a generalized case, the depths of all trenches and troughs tends to be uniform.) In this case, the trench 34a is narrower than the trench 34b, and the trough 40 is narrower than the trough 42.

FIG. 3 sets forth dimensions of interest, namely:

t$\emptyset$, which is the initial thickness of the oxide 38. After removal of excess oxide, t$\emptyset$ will be zero over the islands 36 (a,b,c). For purposes of this discussion, t$\emptyset$ is assumed to be equal both within and without the trenches;

t1, which is the in-process thickness of the oxide 38, after partial removal of excess oxide;

t2, which is the in-process thickness of the trench fill material within the wide trench 34b;

$W_S$, which is the width of the narrow trench 32;

$W_L$, which is the width of the wide trench 34; and h, which is the initial depth of the "feature", in this case of the trenches 40 and 42 sought to be planarized.

In an "idealized" case, the troughs 40 and 42 also have widths $W_S$ and $W_L$, respectively.

As illustrated in FIG. 4, a polishing pad 44 has an irregular surface, illustrated herein as features 46a and 46b. These pad features are simply surface irregularities. The pad carries abrasive particles (not illustrated) for polishing the semiconductor device 30, and these particles are typically much smaller than the trench width. As illustrated, the pad features tend to be larger than the trench widths. Because the pad 44 is resilient, its abrasive surface will tend to remove material from the bottom of a relatively wide trench (e.g., 42), without removing material from the bottom of a relatively narrow trench (e.g., 40). This will result from the fact that the polishing pad is not infinitely stiff, but rather is compliant and can deflect into wide trenches.

Returning to FIG. 3, the top surface topography prior to polishing is shown by the solid line 48, and the top surface topography after partial polishing is shown by the dashed line 50. Evidently, if during removal of material (t0-t1) from over the islands the polishing pad removes material (to-t2) from within the wide trench (42), the object of planarization would be defeated, and even exacerbated as polishing continues.

Another problem is measuring the effectiveness of polishing.

Another problem is polishing where trenches having a wide range of widths is involved.

Another problem is that polishing is slow, compared to etching.

DISCLOSURE OF THE INVENTION

It is therefore an object of the present invention to provide a usable model of the polishing process that describes various phases of trench planarization by wafer polishing in a manner suitable for understanding, characterizing and optimizing the process.

It is a further object of the present invention to demonstrate a practical application of the technique with regard to planarization of LTO-filled shallow silicon trenches.

It is another object to provide a simple, yet comprehensive method for optimizing the planarization process, so as to better be able to meet the goal of obtaining a perfectly planar structure.

It is a further object of the present invention to improve the manufacturability of semiconductor devices, especially where trench isolation and polishing planarization are used.

It is a further object of the present invention to improve the planarization capabilities of the polishing process by reducing the thinning (gouging) of trench-fill material in large trenches, and in general to make the isolation thickness more uniform across the wafer and less sensitive to feature (trench) size, shape and location.

It is a further object of the invention to provide a technique for planarization and further thinning (if desired) of features, such as isolation structures, having protruding portions and ground level portions, while overcoming the inherent low productivity of polishing techniques.

According to the invention, polishing is performed on a sample specimen having features resembling those to be polished in a production semiconductor device. In the sample, trench planarization by mechanical polishing is described and characterized in three distinct phases (regimes). With reference to the parameters set forth in FIG. 3:

1. Planarization In a "Planarization Phase", only the highest parts of the top surface are removed. This would result from either:
   a) an already planar surface (not illustrated, but which would exist in the case of t2=t1+h
   b) having a perfectly flat and stiff polishing pad (which hardly represents reality).

2. Smoothing In a "Smoothing Phase", all parts of the top surface are being polished back, but at different rates. This would result in the case of: (t0-t2)<(t0-t1) The dashed line - - in FIG. 3 is representative of this case.

3. Blanket Polish Back In a "Blanket Polish Back" phase, all parts of the top surface are removed at an equal rate: (t0-t2)=(t0-t1).

According to the invention, the three phases of polishing are described in terms of feature (trench) Width (W, see FIG. 3) and the Feature Aspect Ratio (FAR): FAR=h/W, where "h" is the feature step height (see FIG. 3). In terms of the features 40 and 42, for simplicity of description it is assumed that Ws is the width of the feature 40 and Wl is the width of the feature 42.

For a given process, polish time is determined so that the trench-fill material will be completely removed from over the top structures (islands 36). Furthermore, there is no benefit in polishing for a longer time than is necessary to remove the trench-fill material from the top of the structures. Time is therefore not an independent parameter.

The evolution of the polishing process is described in terms of the variation of feature aspect ratio, that is the variation of residual step height (h) as it decreases towards zero.

The three phases of polishing are characterized by a "Relative Polish Rate" (RPR), which is the ratio of polish rate inside the trenches to the polish rate outside the trenches (atop the islands). Again, with reference to FIG. 3:

$$RPR = (t0\text{-}t2)/(t0\text{-}t1)$$

The Relative Polish Rate (RPR) can also be described in *mathematical form as:

$$RPR = dt2/dt1$$

The Polish Rate (P) can also be described as the derivative of thickness removed (R) versus time (T):

$$P = dR/dT$$

Accordingly, to the representation in the space of feature aspect ratio, the RPR is defined as:

$$RPR = (dRi/d(FAR))/(dRo/d(FAR))$$

where Ri and Ro are the thickness being removed from inside the trenches and outside the trenches, respectively.

Furthermore, the RPR is described in terms of the feature size "W". Since "real" polishing pads are not infinitely stiff, they can conform to the surface topography to an extent that depends on the feature size.

The feature size can be approximated to the trench size, although in principle one should account for the size of the actual feature being polished.

FIGS. 5A and 5B show initial and intermediate phases, respectively, in polishing back trenches (troughs) 52 and 54 in an insulating material 56 overlying a trenched substrate 58, and illustrate that if the effective step dimension changes during polishing, the relevant dimension from the viewpoint of pad conformity must be measured.

Hence, in the general case, the RPR will be written:

$$RPR = \Delta Ri/\Delta Ro = (dRi/d(FAR) + dRi/dW)/(-dRo/d(FAR) + dRo/dW)$$

where partial derivatives are used.

The RPR is a measure of the process's ability to selectively remove material from outside the trenches rather than from inside the trenches. In the planarization mode, no material is removed inside the trenches, i.e. $\Delta Ri = \emptyset$, and hence $RPR = \emptyset$. In the blanket polish mode, material is removed at an equal rate inside and outside the trenches, i.e. $\Delta Ri = \Delta Ro$, and $RPR = 1$. When $0 < \Delta Ri < \Delta Ro$, smoothing prevails, and $0 < RPR < 1$.

According to another embodiment of the invention, a single "quality" characteristic is defined for optimizing wafer polishing processes, and measurements can be taken either on a sample piece or a production piece. The technique is suitable for optimization with Taguchi methods, designs of experiments, and for reduction of process sensitivity to all parameters. The quality characteristic is designed to increase with improved polishing performance, so that it starts at a low value (before processing) and increases to a high value as the wafer becomes more planar, and decreases again after the optimum polish time has been reached. The quality characteristic is particularly well suited to planarization of LTO-filled shallow trenches. It provides clear process goals and strategy for polishing optimization. It also provides a way of measuring the outcome of polishing operations.

According to an aspect of the invention, a wide trench is made to behave like two narrower trenches by applying a relatively hard mask, somewhat narrower than the trench, over the trench fill material at trench-top level. For example, a thin ("cap") layer of nitride is applied over an LTO layer overlying a trenched substrate. Non-selectively applied, the nitride covers the LTO both above the islands (between substrate trenches) and covers the trenches (troughs) in the LTO. When polishing removes the nitride over the islands, there is nitride remaining in the bottom of the LTO troughs, essentially at trench-top (substrate) level. The nitride may also be selectively applied only in the LTO troughs. In either case the LTO trough bottom is harder than the remaining LTO layer being polished. Since the LTO trough bottom is somewhat narrower than the substrate trench opening, a simplistic view is that the residual nitride in the LTO trough bottom acts as a polishing stop to prevent gouging the LTO in the wide substrate trench.

Further according to the invention, elevated (protruding) portions of semiconductor features are removed by first applying a cap layer, then polishing sufficiently to perforate the cap layer, thereby creating self-aligned holes over the elevated portions, then etching the elevated portions. At this point, the cap layer can be removed, and the feature is planar. Further thinning of the resulting planar structure can be continued with etching uniform to the cap layer (prior to stripping) and the feature material, or the cap layer can be stripped and etching can continue.

Other objects, features and advantages of the invention will become apparent in light of the following description thereof.

BRIEF DESCRIPTION OF THE DRAWINGS

FIG. 8 is a three-dimensional representation illustrating the three different polishing phases (regimes) of the present invention.

FIG. 18 is a Table of experimental data contrasting the Quality Characteristic for polishing LTO-filled shallow trenches, with and without the nitride cap layer of the present invention.

FIG. 19A is a cross-sectional view of a raised feature of a semiconductor device, and FIG. 19B is a cross-sectional view of the device after planarization by polishing, according to the prior art.

FIG. 20A is a cross-sectional view of a semiconductor device having a raised feature, incorporating a nitride cap according to the present invention.

FIG. 20B is a cross-sectional view of the device of FIG. 20A, after partial (quick) polishing.

FIG. 20C is a cross-sectional view of the device of FIG. 20B, after etching

FIG. 20D is a cross-sectional view of the device of FIG. 20C, after stripping the residual nitride cap.

DETAILED DESCRIPTION OF THE INVENTION

Characterizing Polishing Regimes

This technique relates to the derivation and use of a parametric model of the process of planarization performed by mechanical polishing. More particularly, the model provides insights into the dynamics of polishing, and allows the application engineer to characterize and optimize the polishing process. The model is directed to the dynamics of planarizing raised areas (islands) surrounded by grooves (trenches), such as would result in the process of forming a Recessed Oxide Isolation (ROI) structure from depositing a conformal oxide layer over a trenched substrate. It is desirable that the oxide layer be planarized.

As noted hereinbefore, polishing can be characterized by three regimes: "planarization", where only the highest parts of a feature are removed; "smoothing", where all parts (high and low) of the feature are being removed, but at different rates; and "blanket polish back" where all parts of the surface are removed at an equal rate. Ultimately, the object is to remove the top surface topological irregularity from the feature being polished, so that blanket polish back can proceed to a desired endpoint.

Figure 6:
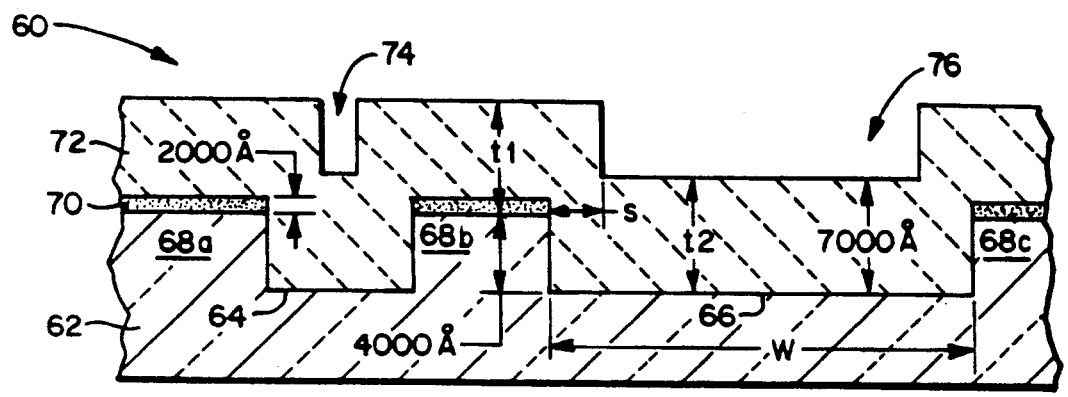
FIG. 6 is a schematic representation of a cross-section of a semiconductor structure, similar to that of FIG. 3, more particularly showing the structure of wafers used for polishing characterization, according to the present invention.

FIG. 6 shows a semiconductor device 60 comprising a substrate 62 with trenches 64 and 66, islands 68a, 68b and 68c and a trench mask 70, as discussed hereinbefore. An overlying layer 72, e.g. of oxide, is deposited over the substrate 62, overfilling the trenches 64 and 66, and has an irregular top surface topography exhibiting trenches 74 and 76, generally conforming to the irregular (trenched) topography of the substrate. The general case, and problems attendant thereto, have been discussed hereinabove.

Using "real" parameters, shallow silicon trenches 64 and 66 (3500–4000 Å deep) are etched with a mask 70 (2000 Å) and filled with 7000 Å of LTO 72 form a 5000 Å step which will be polished. Hence, $t1 = t2 = 7000$ Å.

In the experiment, trenches having widths varying from 8 μm to 1.144 mm were polished for 30, 60, 150 and 240 seconds, using different wafers for each polish time. LTO thickness was measured before and after polishing, inside and outside the trenches. The Feature Aspect Ratio (FAR) was computed at each measurement site based on oxide thickness inside and outside the trench. The silicon step height was assumed to be 4000 Å, throughout.

The amount of material (72) removed inside and outside the trenches is plotted in FIG. 7 (A-E). The solid lines indicate fits. The logarithm of thickness removed is shown for inside trench data (FIG. 7C-E). In each of the plots of FIGS. 7A-E, four distinct "packets" of data are observed, each corresponding data from a different polish time. The spread in each packet is the result of across-wafer polish non-uniformity, pad pressure variations, measurement errors and other approximations (e.g., uniform silicon step height assumption).

Thickness removed outside the trench (Ro) versus Feature Aspect Ratio (FAR) was found to be well fitted by a linear model with a cross-term (FAR)W to account for the fact that polish rate (dRo/d(FAR)) depends on feature dimension (W). In this case:

$$Ro = 540.2 + 9.216 \times 10^{-4}(W) + 16702.9 \cdot (FAR) - 3.069(FAR)W$$

The slope of that line represents the polish rate and is found to be lower for large islands (outside trench).

Figure 7A:
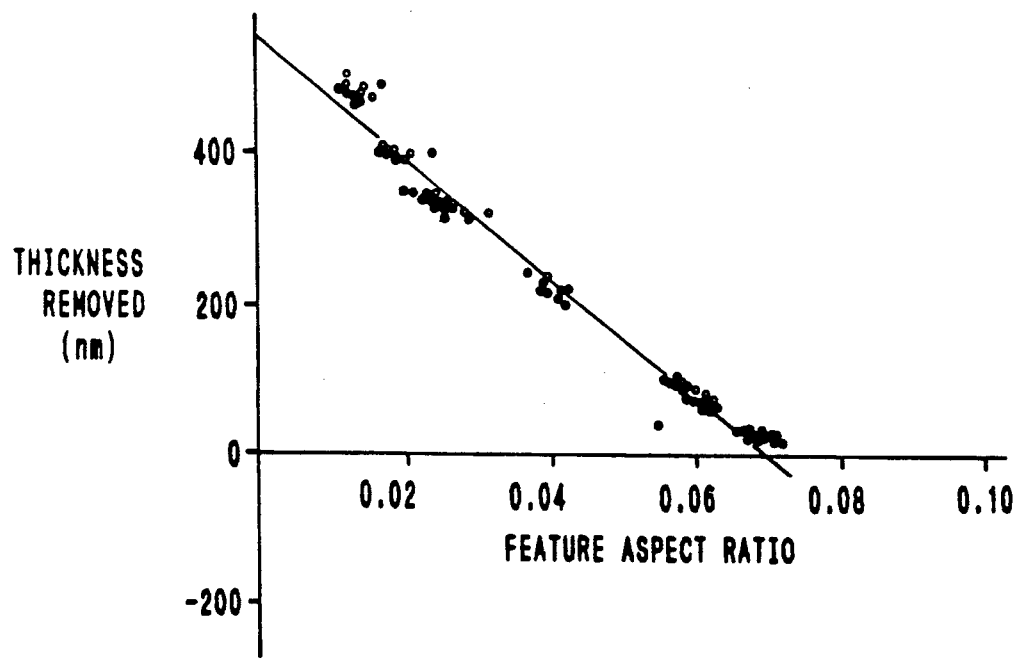
FIGS. 7A-7E are graphs illustrating experimental data for thickness removed versus Feature Aspect Ratio for different trench sizes, according to the present invention.
Figure 7B:
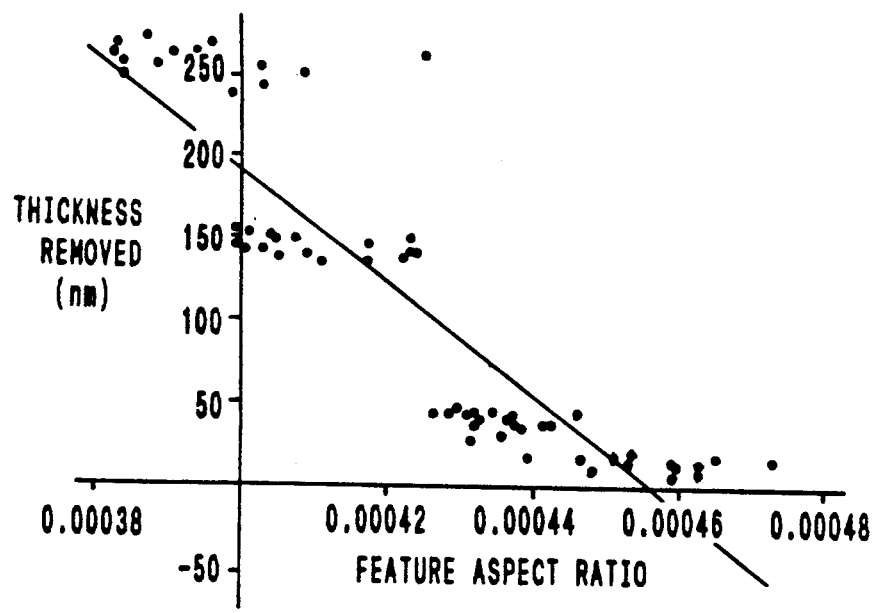
Figure 7C:
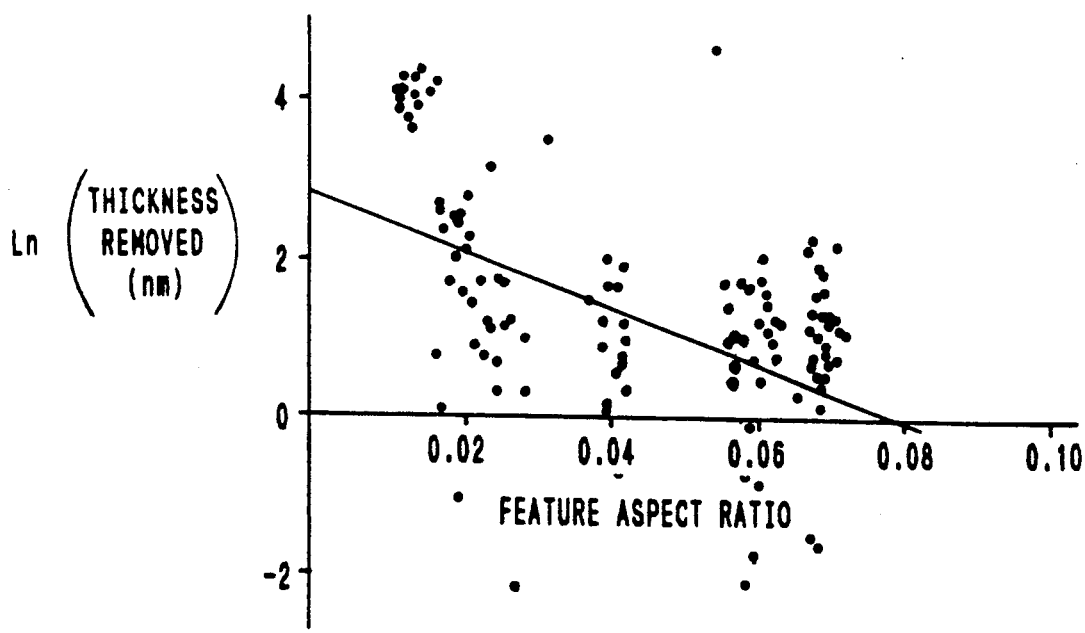
Figure 7D:
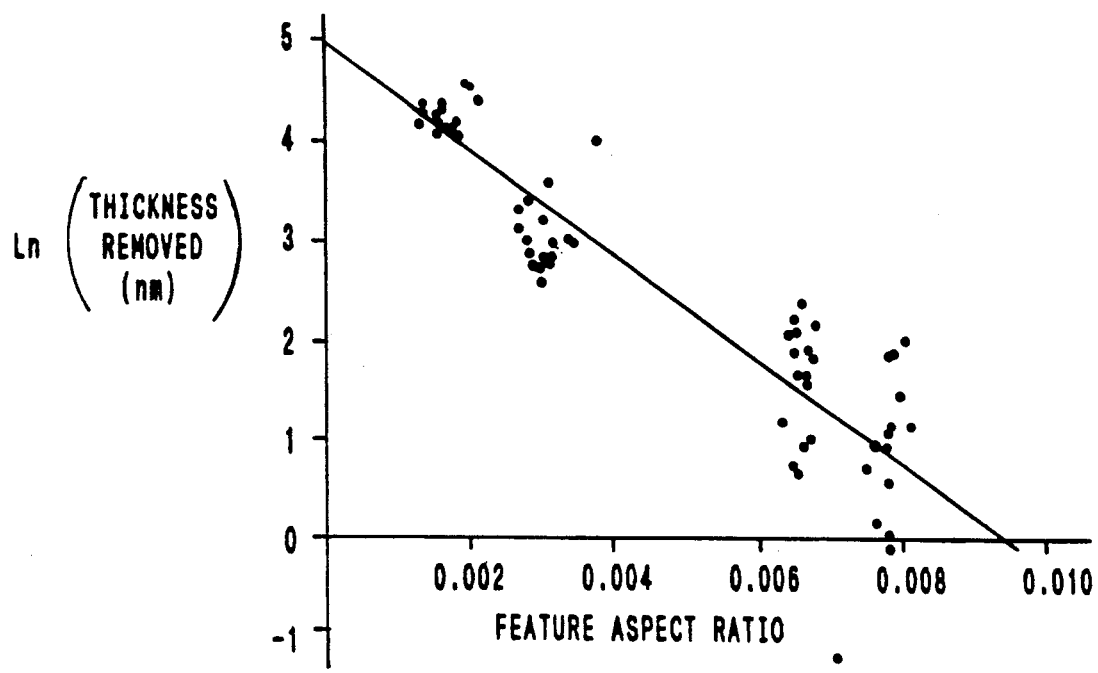
Figure 7E:
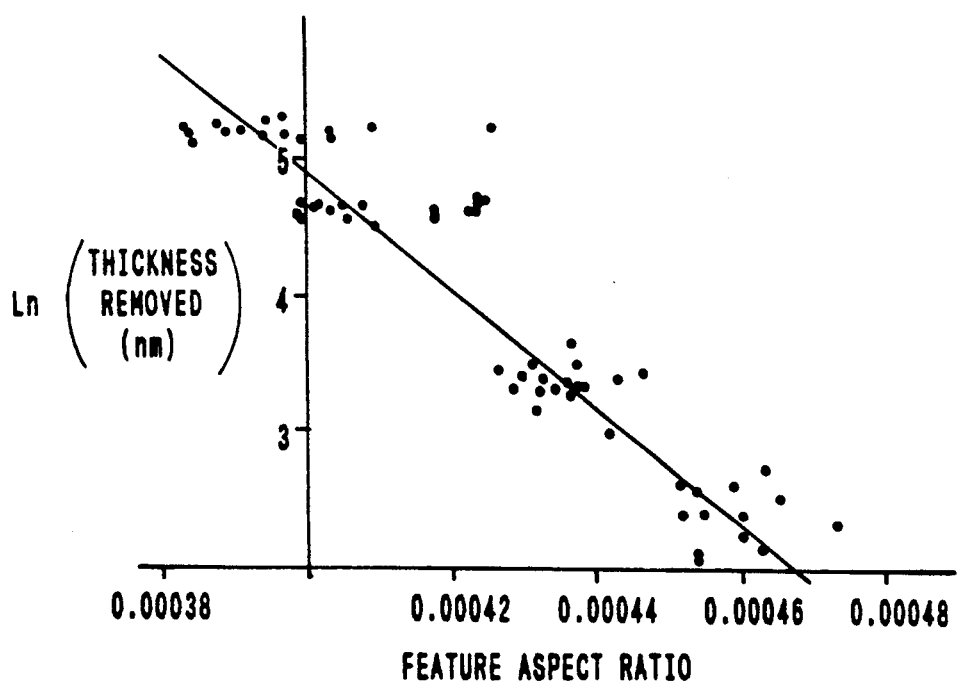

Considering the plot of FIG. 7A, (the island itself is 15 μm), note how data points of each packet line up along the fitted line, indicating that the FAR is indeed the determining factor. Individual packets of data corresponding to the larger outside trench (FIG. 7B) are horizontally distributed, indicating that it is not the FAR of the inside trench that matters, but other factors such as the dimension of the island itself, or possibly pad pressure.

Inside trench data fitted well to a logarithmic model:

$$ln(Ri) = a(FAR) + b$$

where a and b are functions of W:

$$ln(a) = cW + d \quad c = -9.45; d = 1.43$$
$$b = f + gW^{\frac{1}{4}} \quad f = 0.40; g = 0.02$$

The RPR was then computed, and plotted versus FAR and W. FIG. 8 is a plot showing the Relative Polish Rate (RPR) as a function of trench dimension (W) and Feature Aspect Ratio (FAR).

The resulting plot shown in FIG. 8 illustrates clearly the different polishing regimes, and how polishing progresses from one regime to another—from planarization to smoothing to blanket polish back. The RPR is shown as a function of trench dimension (W) in nm on a log scale, with pointers of typical sizes used in generating the model, i.e. 10 μm, 60 μm and 1 mm. The other axis represents the feature aspect ratio (FAR) given by:

$$FAR = (4000 + t1 - t2/(W - 2s)\text{Å},$$

also on a log scale with arrows indicating the range of FARs spanned by the 60 μm and the 1 mm trenches. The 8 μm trench is not represented, as it lies in the flat portion of the RPR surface.

The RPR is plotted on a scale between 0 and 1 to indicate transitions from planarization, to smoothing, to blanket polish back. The evolution of the FAR as polishing reduces residual step height is indicated by the bold arrow 80 along the RPR surface.

The portion of the surface that lies near RPR=0 indicates planarization (as indicated by the legend "planarization regime"), while the portion that is chopped at RPR=1 indicates blanket polish back (as indicated by the legend "blanket polish back regime"). The transition between these two regions corresponds to the smoothing regime (as indicated by the legend "smoothing regime").

It should be noted that since no data is available on large trenches (1 mm) with aspect ratios above $10^{-3}$, the right hand portion of the plot (as viewed) is not representative of the RPR, which is expected to be 1.

Figure 5A:
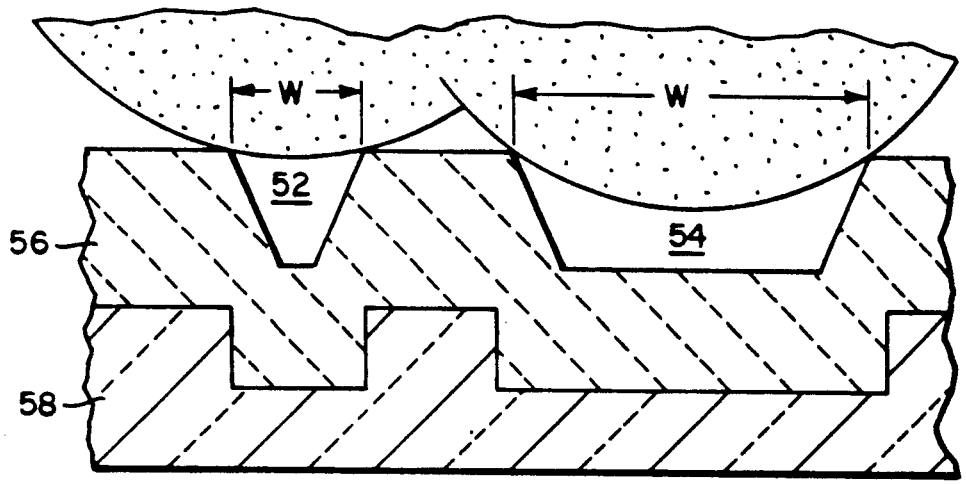
FIGS. 5A and 5B are schematic representations of a cross-section of a semiconductor structure, similar to that of FIG. 3, more particularly showing that if the effective step dimension changes during polishing, the relevant dimension from the viewpoint of pad conformity must be measured.
Figure 5B:
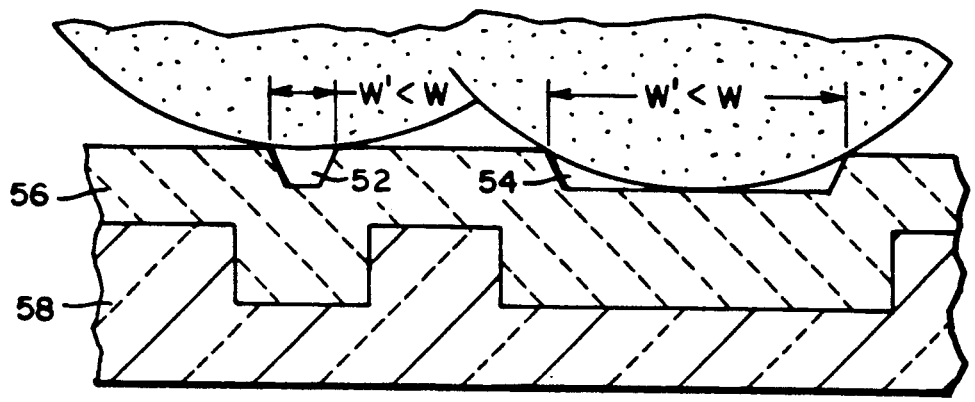

The plot further shows that the 10 μm trench is always in a planarization mode (regime) within the range of FARs covered in this experiment. The 60 μm trench starts in the planarization mode and goes into smoothing when $FAR < 10^{-2.5}$. Finally, the 1 mm trench is always in a blanket polish back mode. If the relevant trench dimension (W) changes simultaneously with the FAR (such as would result from a sloped trench, such as is illustrated in FIG. 5A), the polishing path (e.g., 80) on the RPR surface would go up the curve in both directions.

It can therefore be seen, that by focusing observations on Feature Aspect Ratio, feature size (W) and relative polish rate (inside trench/outside trench), rather than time (e.g.), a valid parametric description of polishing trenches (e.g., LTO-filled trenches) can be obtained. Three distinct phases of polishing become readily apparent—planarization, smoothing and blanket polish back.

With this methodology, parameters are readily extracted to reflect the performances of a given process or hardware. Semiconductor device fabrication can be expedited, by characterizing the evolution of the polishing process according to the inventive technique, with commensurate increases in throughput.

Pressure is also believed to be a relevant parameter, but is omitted from the present methodology.

Quality Characteristic

In this related technique, a single parameter, "quality characteristic" (Q), is defined for optimizing wafer mechanical (abrasive) polishing.

Figure 9:
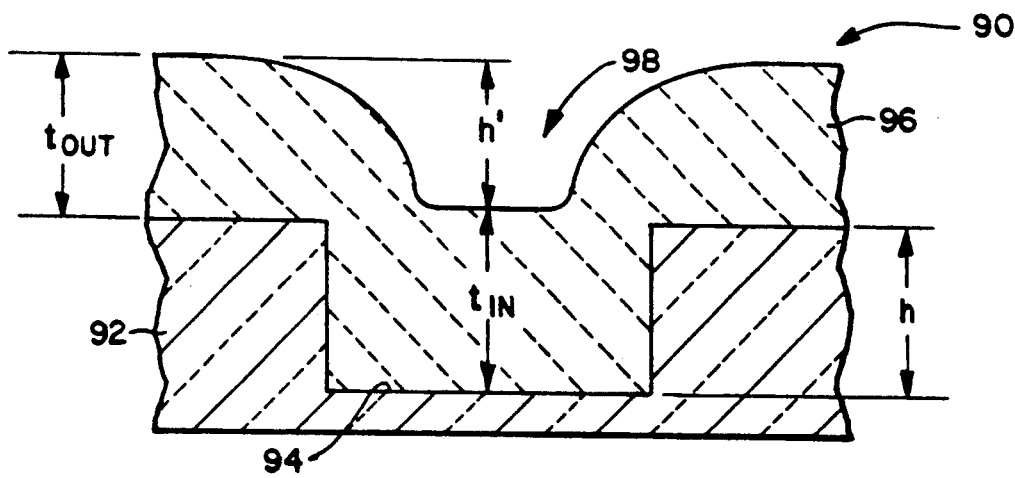
FIG. 9 is a cross-section of an overfilled trench (feature in need of planarization), showing critical parameters of the present invention.

FIG. 9 shows a semiconductor device 90 having a substrate 92, a trench 94 and LTO 96 over-filling the trench 94. As in the previous embodiment, the top surface of the LTO 96 is irregular, and has a trench 98 more or less conforming to the substrate trench 94. The parameters of interest here are the thickness of the LTO outside of the trench ($t_{out}$) and the thickness of the LTO inside the trench ($t_{in}$). The silicon trench step height is defined as h, and the residual step height, or height of the LTO feature 98 is defined as h'. Again, the technique of the present invention is applicable to other than LTO-filled trenches.

As noted hereinabove, polishing performance depends on several parameters: polish pad type, slurry composition and temperature, platen, arm and chuck rotating speeds, pressure applied on the wafer, design of the structure itself (see discussion below, relating to "cap layer").

The present invention offers a simple, yet comprehensive method for optimizing the planarization process. The method must define what to measure, how to analyze data and provide a simple result (good or bad, better or worse).

Figure 10:
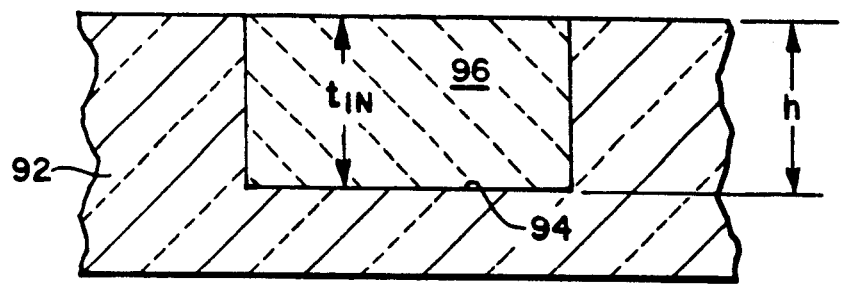
FIG. 10 is a cross-section of the device of FIG. 9, after planarization.

The goal is to obtain a perfectly planar structure, as shown in FIG. 10, where the trench fill material, preferably LTO, is flush with the silicon surface outside the trenches.

In order to arrive at this goal, a "figure of merit", $\delta$, is defined as:

$$\delta = (t_{in}/h)(1 - t_{out}/t_{in})$$

where:
  $t_{in}$ is the trench-fill isolation thickness inside the trench (94); and
  $t_{out}$ is the trench-fill material thickness outside the trench (94).

Before processing, $t_{in}$ is approximately equal to $t_{out}$, and $\delta = 0$. When polishing is completed, $t_{out} = 0$, and $\delta = t_{in}/h$ represents the degree to which the trench is filled. A perfectly planar surface, such as is shown in FIG. 10, will have $\delta = 1$. If thinning (gouging) of the isolation material (within the trench 94) occurs, such as is apt to happen in very large (wide) trenches, then $\delta < 1$.

Figure 11:
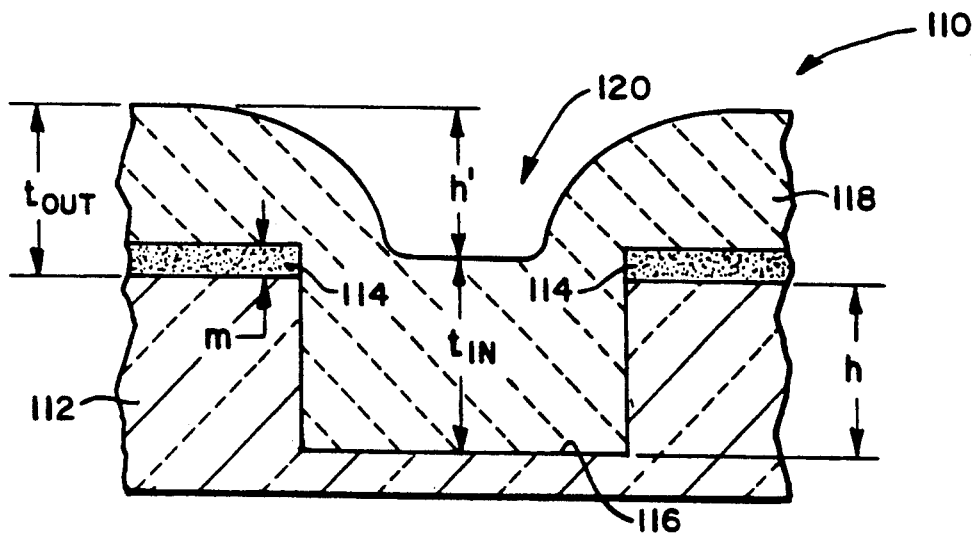
FIG. 11 is a cross-section of an experimental structure, similar to FIG. 9, used to explain and validate the technique of the present invention.

FIG. 11 shows a test structure (specimen) 110 having a substrate 112, a trench mask 114 of thickness m, a trench 116 formed in the substrate, LTO-trench fill 118 over-filling the trench 116, and a trough (trench) 120 remaining in the trench fill material over the substrate trench 116. The trench 116 is about 4000 Å deep, the mask thickness m is about 2000 Å before trench etch and about 1300 Å after trench etch, and the trench is over-filled with about 7000 Å LTO. The figure of merit ($\delta$) is calculated according to:

$$\delta = (t_{in}/h)(1 - t_{out}/(t_{in} + m))$$

so that $\delta$ conserves its properties ($\delta \approx 0$ before processing, $\delta = t_{in}/h$ after processing). LTO was used for the trench mask 114, rather than nitride (e.g.), so as to allow for measurement of the LTO trench-fill layer outside the trench 116 over the trench mask (i.e., $t_{out}$) using interferometry.

Trenches having various widths, from 8 μm to >1 mm wide were formed on the test wafer, and evenly distributed across the wafer so that a quality characteristic could be determined for different size trenches at different locations, on the theory that polishing may proceed unevenly across the wafer. A Wild Leitz automatic film thickness measurement system with pattern recognition was used to sample the data. Polishing times of 30, 60, 150, 240 and 600 seconds were employed, and the figure of merit ($\delta$) was calculated at each of these intervals (including "time zero" prior to polishing).

Figure 12:
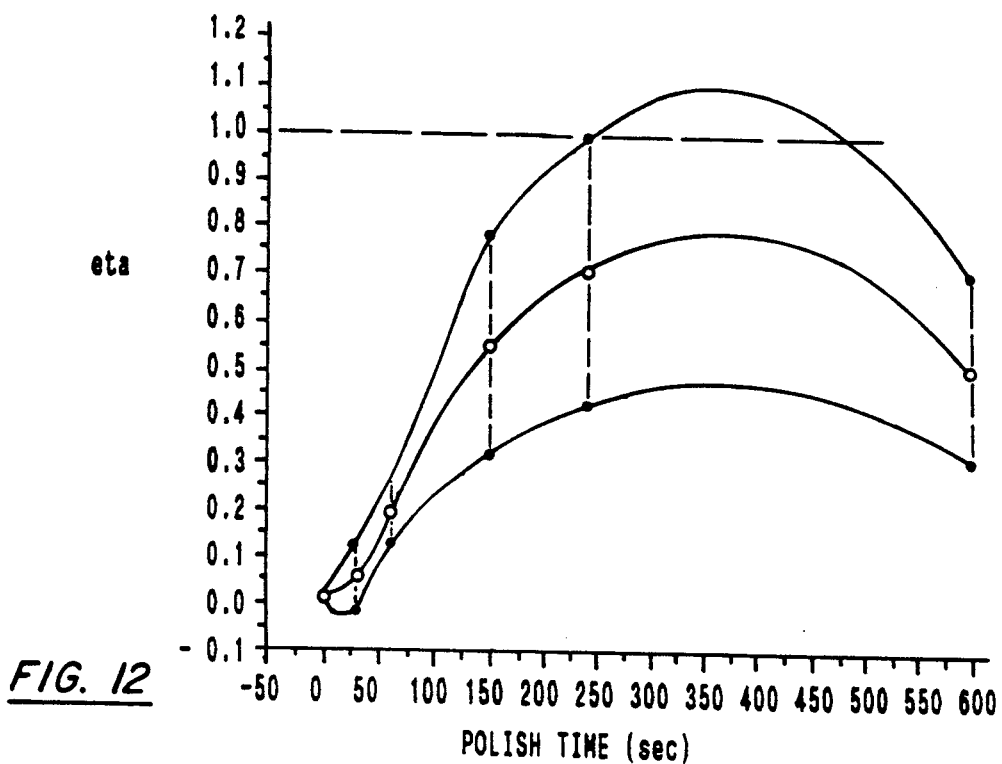
FIG. 12 is a graph of Efficiency ($\delta$) of the polishing process as a function of polish time, according to the present invention.

FIG. 12 shows a plot of average $\delta$ (figure of merit, or efficiency; "eta" is "$\delta$", herein) as a function of polish time with error bars indicating the standard deviation. In this graph, efficiency ($\delta$) versus time is readily apparent.

The goal is not only to have $\delta = 1$, but to also minimize the standard deviation ($\sigma_\delta$) of the efficiency ($\delta$). It is important to recognize that, during actual processing, polish time is not an independent parameter. Rather, LTO must be removed from outside the trenches (e.g., from overlying the islands) with a safe margin for polish rate non-uniformity.

FIG. 12 shows that $\delta$ "peaks" at a time that corresponds to a typical process time (about 350 seconds) for the exemplary LTO thickness. Then, it decreases again—a rather non-intuitive result. Concurrently, the graph illustrates that polishing should be stopped at the point where the standard deviation (spread in LTO thickness) is at its maximum—again, a rather non-intuitive result.

According to the invention, a Quality Characteristic, Q, has been devised so that both $\delta$ and $\sigma_\delta$ can be compounded into a unique function that reflects the overall process performance. Q is defined as follows:

$$Q = Ln(f(\delta)/\sigma_\delta); f(\delta) = 1/(t\sqrt{2\pi})e^{-\frac{1}{2}((\delta-1)/t)^2}$$

where "t" is a tolerance factor on $\delta$. If $t = 0.03(\pm 3\%)$, this means that $0.97 < \delta < 1.03$, which is acceptable. The Quality Characteristic (Q) is such that it increases when $\delta$ approaches one and $\sigma_\delta$ approaches zero.

Figure 13:
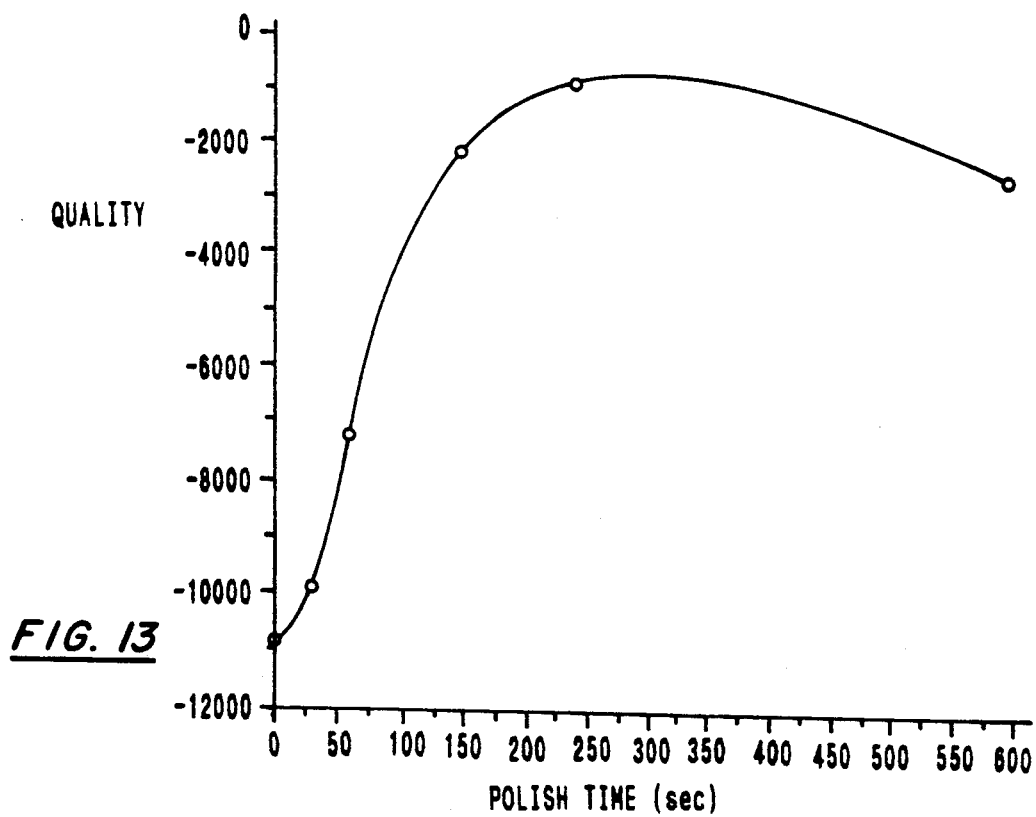
FIG. 13 is a graph of Quality Characteristic (Q) for the polishing process as a function of polish time, according to the present invention.

FIG. 13 graphs the Quality Characteristic (Q) as a function of polish time, based on the experimental results discussed above. It can be observed, on this graph, that "Q" starts at a low value (−11500) and increases as the surface becomes more planar (with increased polishing). More notably, however, the flattening out of the curve (e.g., after 250 seconds polishing) illustrates the compromise between higher $\delta$ and $\sigma^\delta$ values, whereas the graph of FIG. 12 showed a well defined peak for $\delta$.

With reference to FIG. 13, and based on typical process parameters, such as those employed in the present experiment, the value of the Quality Characteristic (Q) increases sharply at the beginning of polishing, peaks at about 240–300 seconds, and then drops slowly as polishing proceeds beyond the endpoint ($t_{out}=0$).

The first two embodiments of this invention (identifying three distinct polishing regimes and defining a Quality Characteristic) provide profound insight into the mechanics of polishing. Results are now quantifiable in an appropriate manner, higher device throughput and yield can be expected, and process parameters can be tailored with more foresight (i.e., less empirically) to particular structures.

Hard-Masking

FIGS. 14–19 illustrate a manufacturing process for an actual device (versus a test specimen), benefiting from the techniques described above, and additionally employing a "hard mask" to increase apparent Feature Aspect Ratio (h/W).

Figure 14:
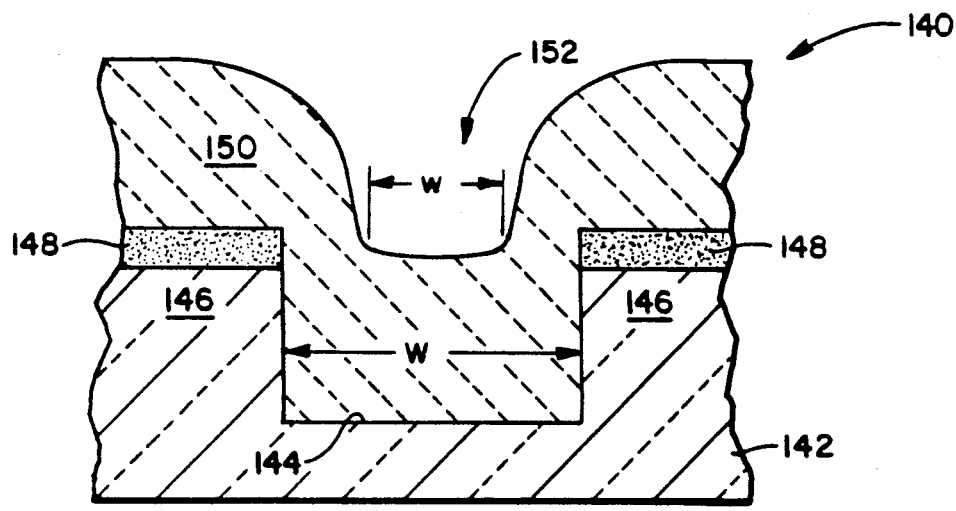
FIG. 14 is a cross-section of a semiconductor device having an overfilled trench, similar to FIG. 9.

FIG. 14 shows a semiconductor device 140, including a substrate 142 and a trench 144 isolating (separating) two islands 146. The trench 144 is formed by etching through a patterned trench mask 118, such as has been described hereinabove.

A blanket layer of isolation oxide (LTO) 150 is applied over the device, and exhibits a trough 152 above the trench 144. By appropriately controlling the amount of trench fill material 150 applied (e.g., deposited) the trough bottom is at or slightly above substrate level, and it is centered over the trench 144. As illustrated, the trough, formed as it is from a generally conformal layer of LTO, will have a bottom width dimension, w, which is somewhat less than the width dimension, W, of the trench 144.

Figure 15:
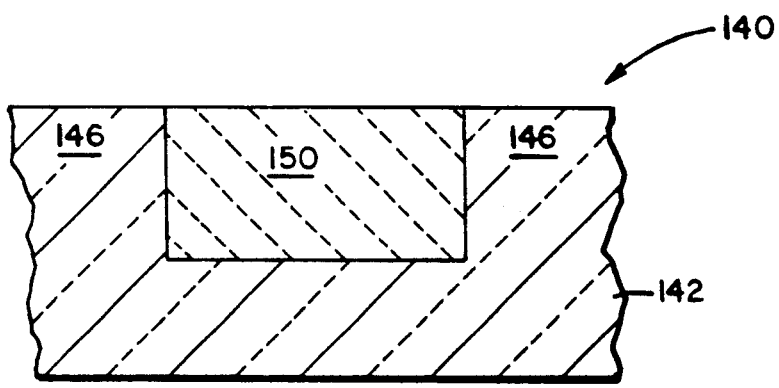
FIG. 15 is a cross-section of the semiconductor device of FIG. 14, after planarization.

FIG. 14 illustrates the "initial" structure (i.e., after deposition of the LTO), and FIG. 15 illustrates the "desired" structure (i.e., after removing excess LTO over the islands 146 and removing the nitride mask). LTO over the islands (outside trenches) is removed by mechanical polishing.

Figure 16:
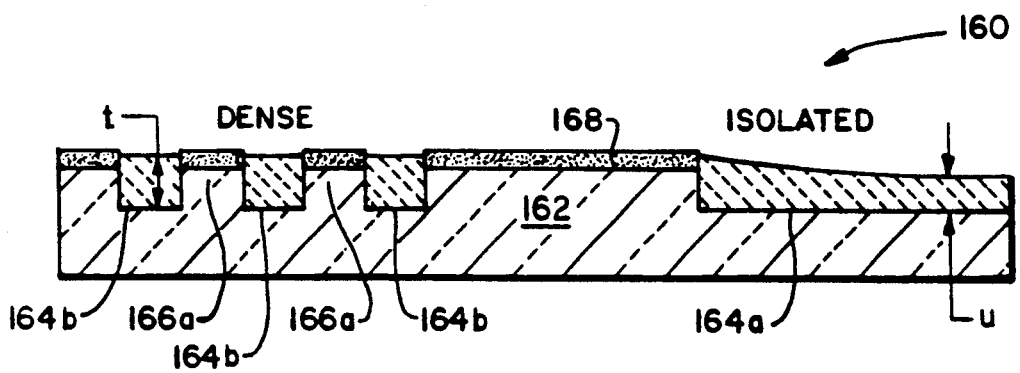
FIG. 16 is a cross-section illustrating the problem of thinning in large LTO-filled trenches, Compare FIGS. 4 and 5.

As is graphically illustrated in FIG. 16, the trench mask, preferably nitride, is left in place during polishing and acts as a polish stop layer, as its polish rate is much slower than that of the LTO. There is however, as discussed hereinabove, a tendency for the LTO filling large (wide) trenches (e.g. >20 μm) to be thinned (gouged) as compared to relatively small (narrow) trenches (<20 μm). FIG. 16 shows a semiconductor device 160 having a substrate 162, a large trench 164a and three small trenches 164b. Two small "islands" 166a are shown between adjacent small trenches 164b, in a "dense" region of the semiconductor device, and a large island 166b is shown adjacent the large trench 164a. A patterned trench mask layer 168 is shown. The trenches 164a and 164b are etched in the usual manner.

FIGS. 17A-17D show polishing progress beginning with the blanket (non-selective) deposition (FIG. 17A) of a thin layer of material (e.g., nitride), which is harder (slower polish rate) than the trench-fill material (e.g., LTO) is blanket (non-selectively) on top of the trench fill material. Alternately, as will become evident, the process can begin at the stage represented by FIG. 17B, with selective deposition of the thin hard layer (e.g., nitride) above the trench-fill material.

Figure 17A:
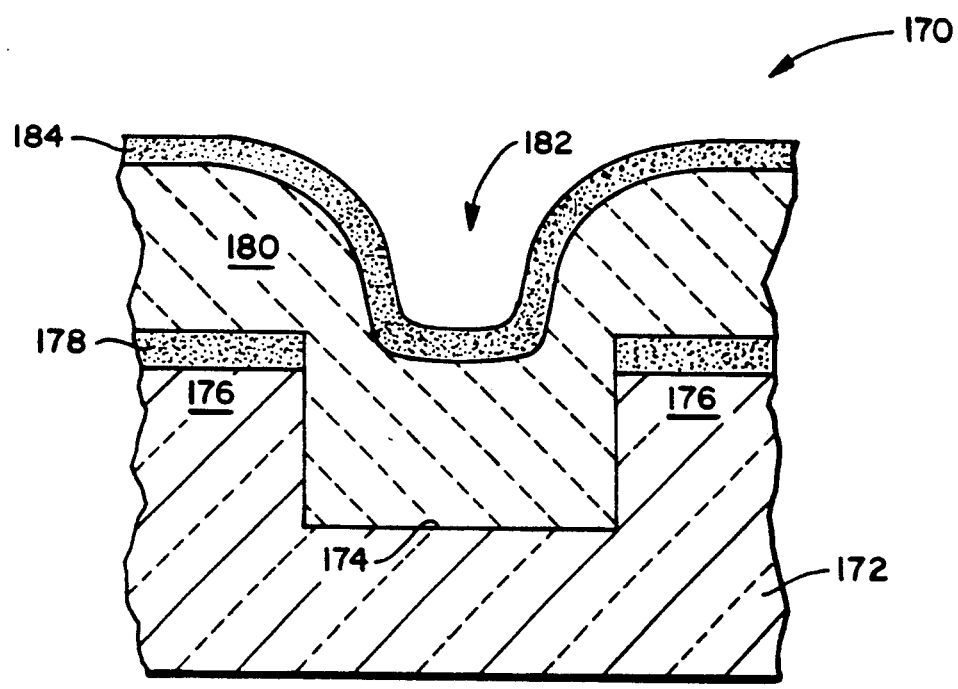
FIGS. 17 (A,B,C,D) are cross-sectional views of a modified structure, according to the present invention, with a nitride cap layer applied.

FIG. 17A shows an "in-process" (incomplete) semiconductor device 170 having a substrate 172, trench 174, islands 176, trench mask 178 and layer of trench-fill material 180. As discussed hereinabove, (FIG. 14), the trench fill material 180 has a trough 182 narrower than and centered above the trench 174. Exemplary process parameters are: 1800 Å nitride for the trench mask 178; 4000 Å trench depth; and 4500 Å LTO for the trench fill (LTO) 180.

A thin nitride "cap" layer 184 is deposited over the LTO 180. Exemplary thickness of the layer 184 is 500 Å.

After trench etch (prior to depositing the layer 180 and the layer 182), the residual nitride mask thickness is about 1300 Å.

Figure 17B:
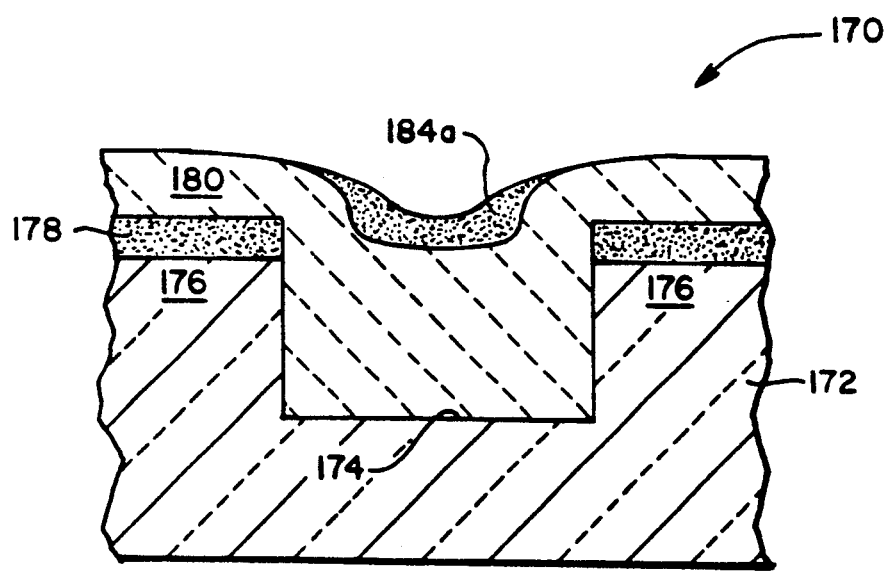

FIG. 17B shows t he partially polished structure of FIG. 17A, wherein the nitride cap layer 184 has been removed outside the trough 182, leaving a thin layer of nitride 184a within the trough 182. Notably, the thin nitride layer 184a within the trough 182 is at approximately the same level as the mask layer 178, in other words at wafer level. The techniques disclosed above, for characterizing the performance of polishing, are very helpful in controlling the removal of the cap layer outside the trough 182.

Figure 17C:
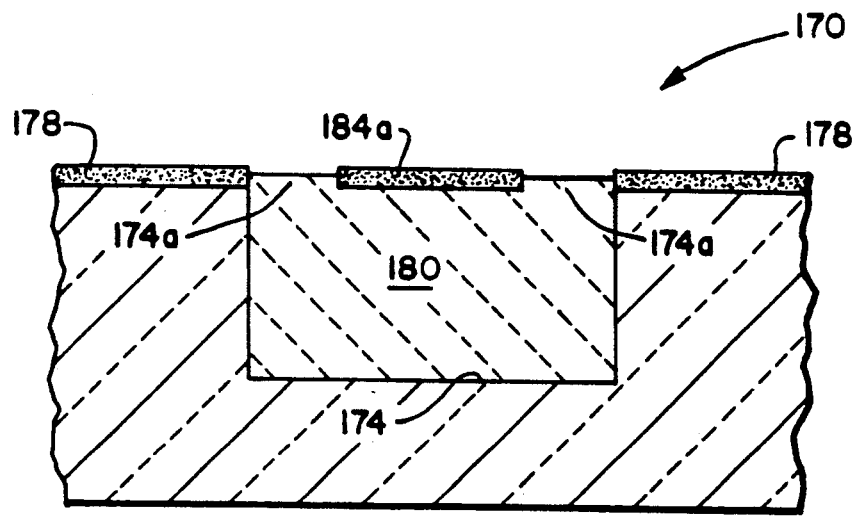

FIG. 17C shows the completely polished structure of FIG. 17A, wherein the mask layer 178 remains, having acted as a polish stop, and the thin nitride layer 184a remains centered over the trench 174, atop the trench-fill material. As polishing proceeds from an intermediate stage, as represented in FIG. 17B to the endpoint, represented in FIG. 17C, it is readily apparent that the trench 174 will behave like two smaller trenches 174a, each having a higher Feature Aspect Ratio (h/W). As explained hereinabove, such a trench will be inherently less susceptible to gouging (thinning of the trench-fill material) by a compliant polishing pad. Additionally, by careful selection of the process parameters, the two apparent trenches 174a are conveniently sized to match the width of other trenches (not shown) on the wafer which are smaller than the trench 174. In this manner, the polishing process and be performed more uniformly across the entire wafer, with respect to features of widely disparate dimension (e.g., width).

The after-polish thickness of the nitride mask 178 is approximately 900 Å.

The nitride cap layer can also be selectively deposited over the LTO layer. FIG. 17B would represent the starting point, or "initial" structure, in this case.

Figure 17D:
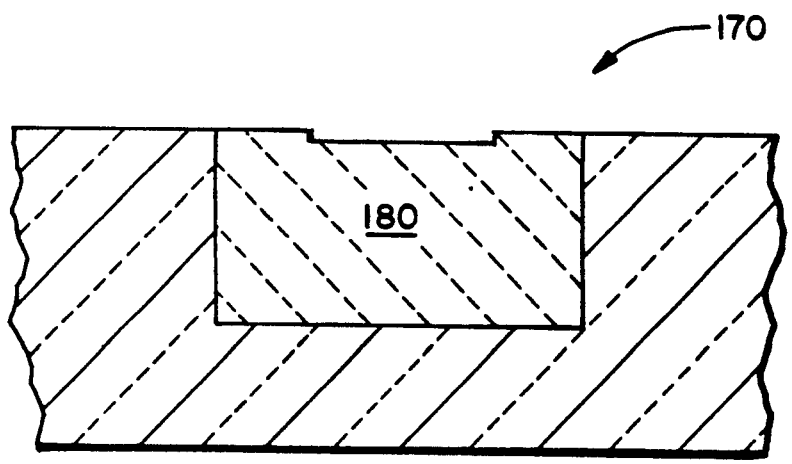

The final step, represented in FIG. 17D, is stripping the nitride mask 178 and residual nitride cap layer 184a.

In essence, the residual nitride cap layer (184a) acts as a "buffer" which "absorbs" polish rate non-uniformities across the wafer. Furthermore, these irregularities are not "imaged" into the isolation LTO and are completely eliminated by stripping off the sacrificial nitride layers (mask and cap layer). As such, the invention offers a significant improvement in the planarization process.

In tests, it was observed that more LTO remained in very large trenches (e.g., >1 mm) on wafers with the nitride cap (184a) than on wafers without it. This is demonstrated in the Table of FIG. 18 where minimum and maximum thicknesses measured on each test wafer as well as mean and standard deviation are given. Wafers #8, #3 and #13 with the nitride cap layer have about 500 Å more LTO than wafers #15, #16 and #12 without the nitride cap layer if minimum thicknesses are considered.

Finally, FIG. 18 shows a comparison of both structures (with and without nitride cap layer) from the viewpoint of their Quality Characteristic ("Quality"), as set forth above. It is readily observed that the wafers having the nitride cap layer exhibit higher Quality values than those without it. Hence, the invention significantly improves the planarization process for large trenches.

By employing the nitride cap of the present invention, both very small and very large trenches planarize very well. Through the greater control over polishing afforded by the invention, less LTO over-fill can be deposited. (Without the invention, it is necessary to overfill sufficiently to allow for subsequent thinning of the LTO within the trenches.)

Advantageously, in the manufacture of active semiconductor devices (many dies per wafer), test structures (specimens) can be located in the scribe lines between dies.

Polishing and Etching

The previous discussion has focused on planarization by polishing, whether purely mechanical or chemical/-mechanical. Polishing has the ability to clear (remove) high spots quickly, but as the surface becomes smoother and more planar, the rate at which bulk material is removed decreases. Wet (chemical) etching can also remove material at a high rate.

More particularly, the polishing of isolation structures has been demonstrated to be an effective way to create substantially planar structures at several levels of semiconductor device fabrication.

According to the present invention, polishing and etching are advantageously employed to planarize structures, such as isolation oxide.

Figure 1:
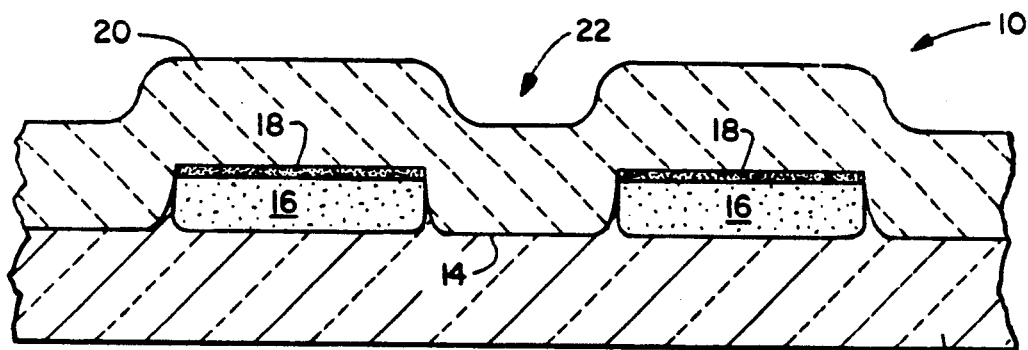
FIG. 1 is a cross-section of a semiconductor structure having irregular surface topology (and hence in need of planarization), according to the prior art. The structure includes islands extending above trenches, and a conformal insulating layer filling the trenches and overlying the tops of the islands.
Figure 2:
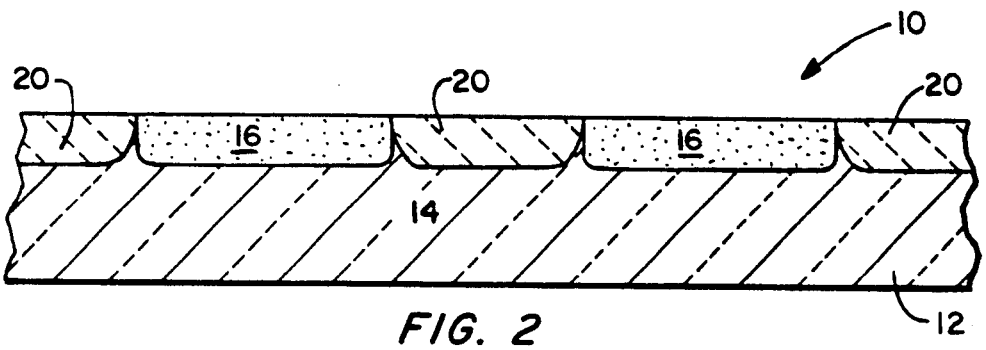
FIG. 2 is a cross-section of the semiconductor structure of FIG. 1, after planarization. The tops of the islands have been removed flush (planar) with the filled trenches.
Figure 3:
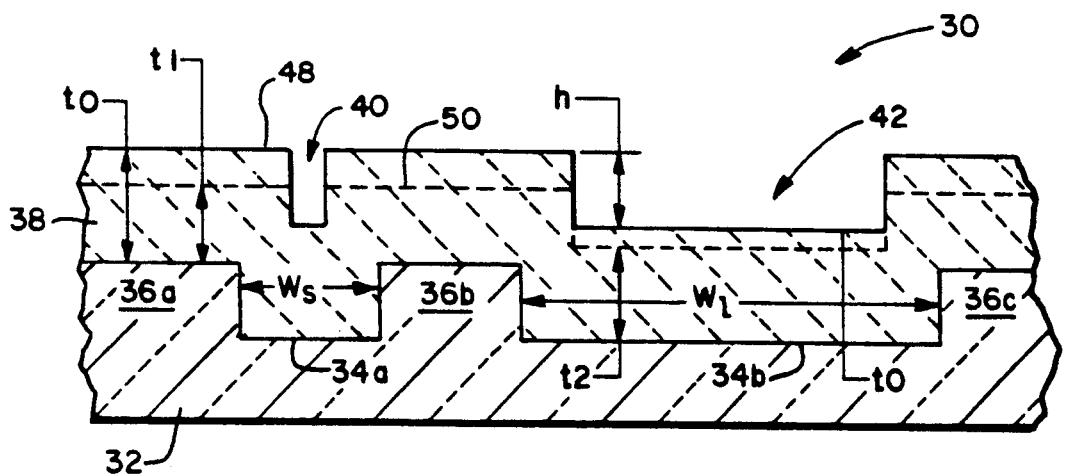
FIG. 3 is a schematic representation of a cross-section of a semiconductor structure, similar to that of FIG. 1, showing parameters relevant to the problems encountered in the prior art as well as the technique of the present invention.
Figure 4:
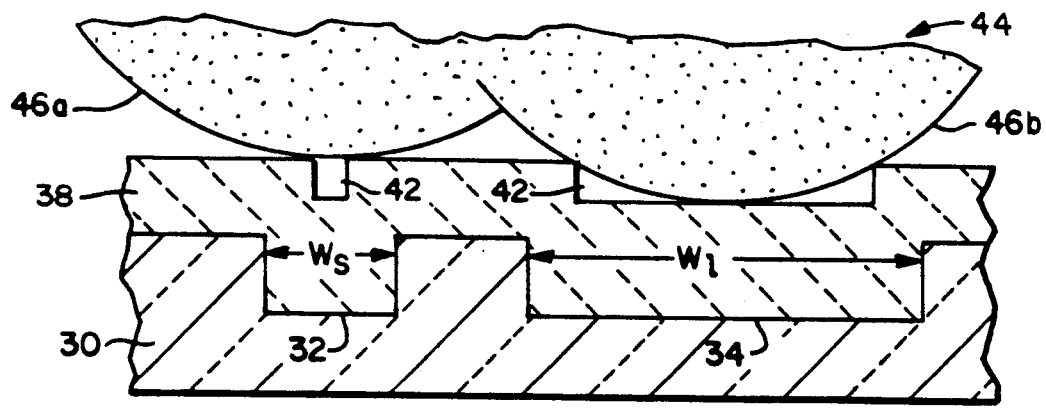
FIG. 4 is a schematic representation of a cross-section of a semiconductor structure, similar to that of FIG. 3, showing an idealized case with a vertical step, and is useful in visualizing two of the three different polishing regimes of the present invention.

FIG. 19A shows a portion of a semiconductor device 190, including an irregular feature 192. A portion 192a of the feature is at "ground" level, which may be wafer level or higher, and a portion 192b of the feature 192 protrudes above ground level. By way of example, if the feature 192 were a LOCOS oxide, the portions 192a would be at wafer level, and would be considered to have essentially zero thickness, and the protruding portion would be the isolation region between diffusion regions. Or, if the feature 192 were an LTO layer overlying a trenched substrate (see e.g., LTO layer 20 in FIG. 1), the portions 192a would have a finite thickness in the isolation region, and the protruding portion 192b would be overlying a diffusion region. In the latter case, the ground level portions 192a overlying the (e.g., trenched) isolation region are likely to require thinning. In either case, planarization of the protruding portion 192b to at least the level of the ground level portions 192a is required, by definition.

FIG. 19B shows the feature 192 after planarization by polishing. Again, the techniques disclosed above for characterizing polishing helpful are in this step.

In the case where it is desirable to remove only the protruding portion (e.g., 192b) of a structure to be planarized, in other words to perform selective material removal, it is possible to employ a blanket hard mask and polishing steps to create openings in the mask, and then proceed with wet etching to remove the protruding portion of the structure. FIGS. 20A–20D illustrate this process.

FIG. 20A shows a portion of a semiconductor device 200, including an irregular feature 202. As in FIG. 19A, a portion 202a of the feature is at "ground" level, which may be wafer level or higher, and a portion 202b of the feature 202b protrudes above ground level. By way of example, if the feature 202 were a LOCOS oxide, the portions 202a would be at wafer level, and would be considered to have essentially zero thickness (non-existent), and the protruding portion would be the isolation region between diffusion regions. Or, if the feature 202 were an LTO layer overlying a trenched substrate (see e.g., LTO layer 20 in FIG. 1), the portions 202a would have a finite thickness in the isolation region, and the protruding portion 202b would be overlying a diffusion region. In the latter case, the ground level portions 202a overlying the (e.g., trenched) isolation region are likely to require thinning. In either case, planarization of the protruding portion 202b to at least the level of the ground level portions 202a is required. As disclosed herein, at least the protruding portion 202b will be removed, and at that point the feature 202 will have been planarized. However, as will become evident, further (planar) thinning of the feature is also possible, and comparable in some respects to "Blanket Polish Back", discussed above. However, as will become evident, such further thinning is performed with an etching process (wet or dry).

FIG. 20A shows the feature 202, for example oxide, covered with a thin layer of a dissimilar material 204, such as nitride. Exemplary thicknesses are 20:1 (oxide:-nitride). This step is comparable to the step illustrated in FIG. 17A, showing a nitride cap layer. In this case, however, it is not necessary that the cap layer 204 be harder than the feature 202, but in some cases it may be preferred. What is essential is that the material 204 be selected for its preferential etching (e.g., chemical etching) with respect to the material 202.

FIG. 20B shows the feature 202 after a polishing step. In this step it is seen that an opening 206 has been created in the "cap" layer 204, in register with the protruding portion 202b of the feature 202. At this point, having removed the cap layer 204 over the protruding portion 202b of the feature 202, polishing is terminated.

FIG. 20C illustrates the endpoint of the next step, which is etching away the protruding portion 202b of the feature 202. Chemical (wet) etching is preferred, but plasma (dry) etching is also a possibility. The endpoint of this step is having reduced the height of the protruding portion 202b to the point where it is level with the portions 202a. Particular process parameters will depend on the material (e.g., oxide) being etched, and the material (e.g., nitride) of the cap layer 204. The goal is to etch the non-planar portion (e.g., 202b) of the feature, without affecting the ground level (i.e, already reasonably planar portion; e.g., 202a) of the feature. It is also possible (not illustrated) to continue selectively etching to reduce the height of the portion 202b to below the level of the ground level portions 202a.

FIG. 20D shows the feature 202, after the cap layer 204 has been stripped away, through known techniques. The resulting top surface topography of the feature is seen to be planar. At this point, if further thinning of the entire feature is desired, any suitable etching technique can be employed. Alternatively, again if further uniform thinning is desired, the etch process parameters can be changed after the endpoint illustrated in FIG.

20C, so that the cap layer 204 and feature 202 are uniformly etched.

With respect to a plurality of similar features (202) on a die, or across a wafer, it is evident that a cap layer (204) can be applied across the entire die (or wafer), followed by polishing sufficiently to create self-aligned openings (206) over the protruding portions of features requiring planarization, followed by etching.

Polishing, in general, is slower than wet etching. By using the quick polish, then etch technique of the present invention, the ability of the polisher to clear high spots quickly is combined with the very rapid removal of material underlying the high spots by the use of purely chemical agents. The precision of the polisher is combined with the rapid removal rate of chemical etchants, thereby creating a process with significantly enhanced productivity.

As used throughout the description of the various embodiments of the invention set forth above, it should be understood that "polishing" includes both abrasive polishing, such as is disclosed (e.g.) in U.S. Pat. No. 4,940,507, or chemi-mechanical polishing, such as is disclosed (e.g.) in U.S. Pat. Nos. 4,671,851, 4,910,155 or 4,944,836, all of which patents are incorporated by reference herein.

Appendices

1. Appended hereto ("App 1") is a twenty page document entitled "Polishing planarization" by Philippe Schoenborn with Nick Pasch, Aug. 9, 1990, which forms part of the disclosure of this invention.

2. Appended hereto ("App 2") is an eight page document entitled "Quality Characteristic for Polishing Planarization" by Philippe Schoenborn, Oct. 19, 1990, which forms part of the disclosure of this invention. ("eta" therein corresponds to "$\delta$" herein)

App 1

Polishing planarization

*by Philippe Schoenborn
with Nick Pasch
August 9, 1990*

Section 1, theory

Parametric description of planarization process by polishing. Establishment of boundry between perfect planarization and smoothing. This is not a transient study but a time-independent analysis of the process Feature aspect ratio "f" :

f[h_,d_]:=h/d

Pad aspect ratio "p" :

p[d_]:=bow[d]/d

Parabolic bow function :

bow[d_]:=a*d^2

■ Case #1 - Exponential step function

Relative polish rate "r" :

assume step function "r" :

g[d_,fd_]:=Exp[-c*(p[d]/fd-b)]
r0=(1.-Exp[-c*(1.-b)])/(1.+Exp[-c*(1.-b)])

$$\frac{1. - E^{-((1. - b) c)}}{1. + E^{-((1. - b) c)}}$$

```
r[d_,fd_]:=0. /;p[d]<=fd;
r[d_,fd_]:=   .5*((1.-g[d,fd])/(1.+g[d,fd]) - r0) /;p[d]>fd
```

Parameters :

a:=1.
c:=1.
b:=5.

```
Plot3D[r[d,fd],{fd,.5,4.},{d,.5,10.},ViewPoint->{2.4,1.3,2.},
BoxRatios->{1.,1.,.6},PlotRange->{0.01,1.},ClipFill->
{GrayLevel[0],GrayLevel[1]},Shading->False,PlotLabel->
"Relative polish Rate",AxesLabel->{"aspect ratio","dimension",
"rpr     "}]
```

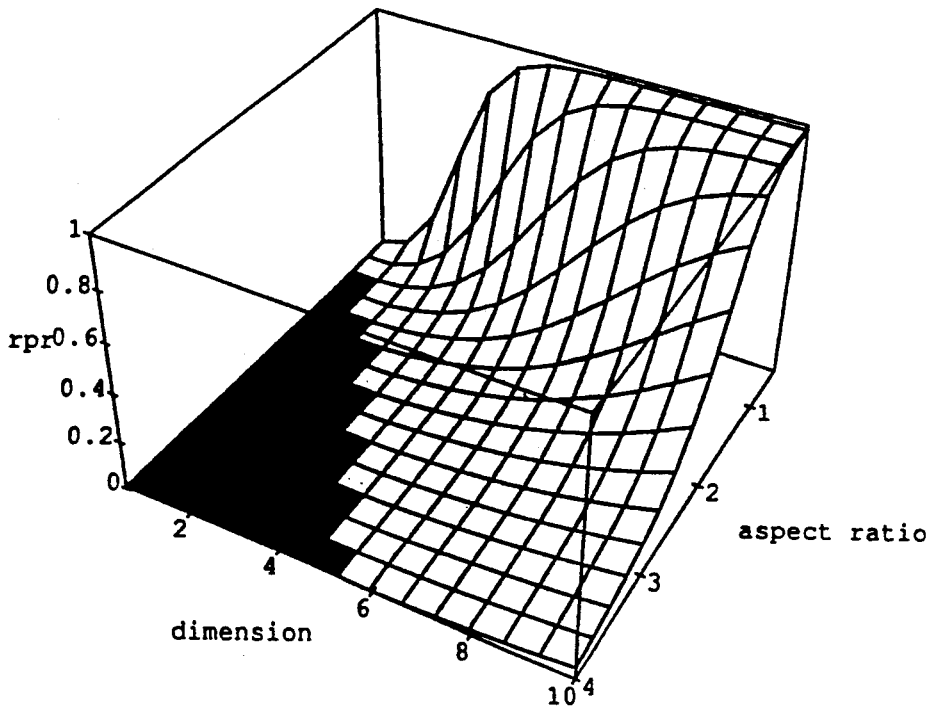

```
Plot3D[r[d,f[h,d]],{h,.5,6.},{d,.5,6.},ViewPoint->{2.4,1.,2.},
BoxRatios->{1.,1.,.6},PlotRange->{0.01,1.},ClipFill->
{GrayLevel[0],GrayLevel[1]},Shading->False,PlotLabel->
"Relative polish Rate",AxesLabel->{"step height","dimension",
"rpr     "}]
```

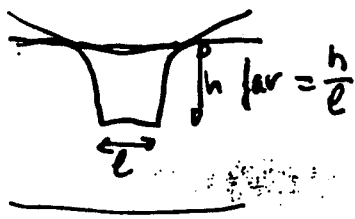

Relative polish Rate
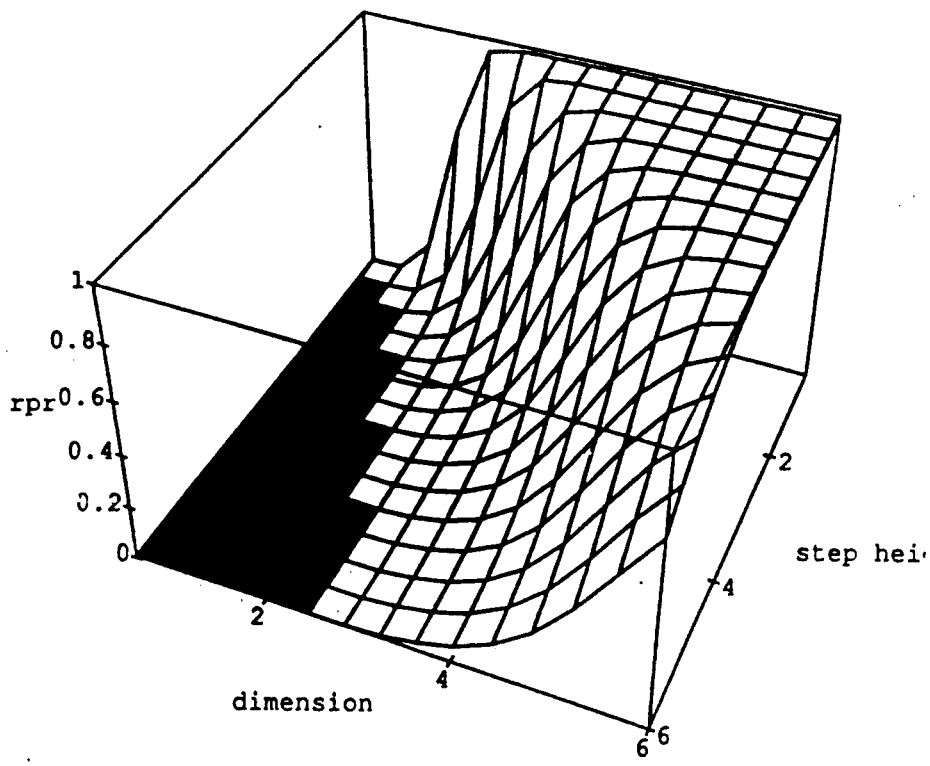
■ Parabolic Step function
Parameters:
a:=1.
q:=.5
r[d_,fd_]:=0. /; p[d]<=fd ;
r[d_,fd_]:=q*(p[d]/fd-1.)^2 /; p[d]>fd
Plot3D[r[d,fd],{fd,.5,4.},{d,.5,7.},ViewPoint->{2.4,1.,2.},
BoxRatios->{1.,1.,.6},PlotRange->{0.01,.99},ClipFill->
{GrayLevel[0],GrayLevel[1]},Shading->False,PlotLabel->
"Relative polish Rate",AxesLabel->{"aspect ratio","dimension",
"rpr   "}]

Relative polish Rate
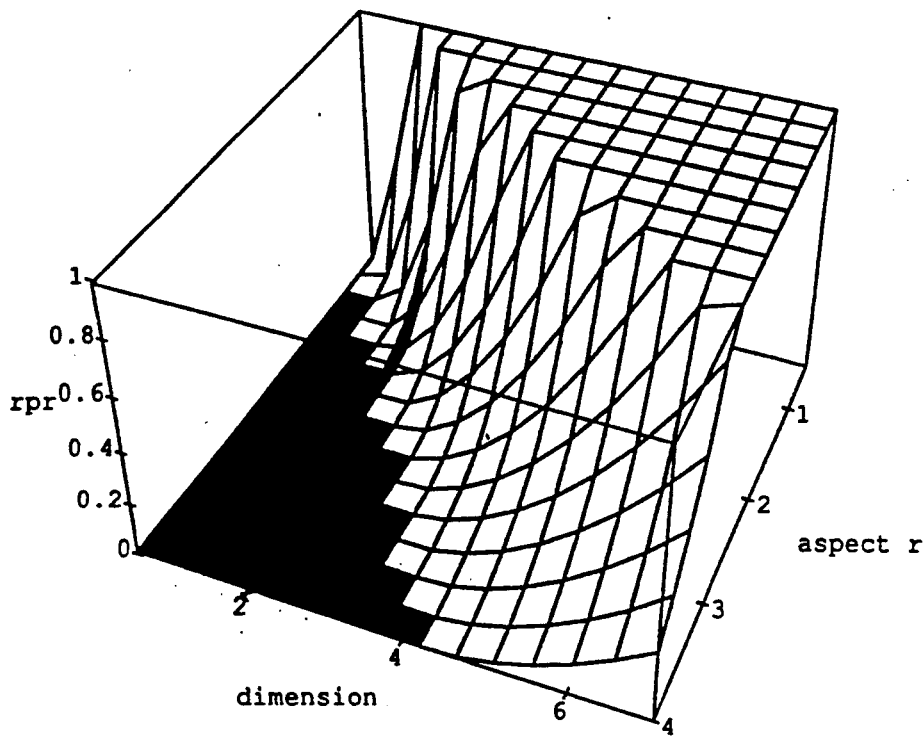
Section 2, experimental
■ Import data :
Identify # of wafers, polish times in sec. & data files :
i=4
pt[1]=30.
filename={"SL917.08B","SL917.08A"};
Polishing planarization
*by Philippe Schoenborn
with Nick Pasch
August 9, 1990*
Section 1, theory
Section 2, experimental
LXA0026 mask ■ Import data :
  !! delete data lines with "aln err" messages in them, in all data files.
  Make sure data files of same wafer have matching measurement positions.
  Make sure data group inside/outside trench are complete
  Check & update groups of cells headed by a ◘ !!

☐ Identify # of wafers, polish times in sec. & data files :

pt={30.,60.,150.,240.}      (* polish times *)
    thickness={} (* contains thickness data *)

(* sort filenames in order of their polish time *)

filename={"SL917.25B","SL917.25A","SL917.10B","SL917.10A",
              "SL917.08B","SL917.08A","SL917.19B","SL917.19A"}
    lf=Length[filename];

Read data files :
    Do[{
    OpenRead[filename[[i]]],
    Read[filename[[i]],{String,String}],
    data=ReadList[filename[[i]],{Number,Number,Number,Number,
                                              Number,Number}],
    Close[filename[[i]]],
    thickness=AppendTo[thickness,
        Transpose[ Transpose[data] [[ {4,5} ]] ]               ]
    },{i,lf}]
    ClearAll[data];

■ Prepare arrays :

Sorting before & after polishing data :

before=Transpose[
            Flatten[ Table[thickness[[2*n-1]],{n,1,lf/2}] ,1] ]
    after =Transpose[
            Flatten[ Table[thickness[[ 2*n ]],{n,1,lf/2}] ,1] ];

Thickness removed in 2D array "r" with measurement positions in first column and thicknesses in second column:

r={before[[1]] , before[[2]] - after[[2]]};

There are 10 measurement sites per die, 6 inside trenches, 5 outside. Let j=1,...,6 be the feature index. Their inside/outside pairs of measurements have been grouped as follows for feature aspect ratio calculation (far). Let k=1,...10 be the measurement no., and i=1,...,19 be the die index.

| j | k | trench size | k | island size | location |
|---|---|---|---|---|---|
| 1 | 1 | 0.008 | 2 | 0.016 | corner array |
| 2 | 3 | 0.008 | 4 | 0.016 | center array |
| 3 | 5 | 0.064 | 2 | 0.016 | between horiz. I/O & array |

```
4  6  0.059   2  0.016    between vert. I/O & array
5  8  1.144   7  0.317    scribe
6  9  0.002  10  0.007    in I/O's
```

☐ Define format of data file and parameters :

Matrix of offsets (first element) & signs (second elements) for inside/outside pairs :

```
mj={{1,-1,1,-1,-3,-4,1,-1,1,-1},
    {-1.,1.,-1,1.,-1.,-1.,1.,-1.,-1.,1.}};
```

(* open cell for more details *)

An offset is the relative position of a data point with respect to its "partner". i.e. inside/outside measurements are partners of a pair whose relative position to one another in the lists of data is given by mj[[1]]. A "-1." sign is attributed to an inside trench measurement while a "+1." sign is attributed to an outside measurement.

Trench dimension matrix (nm) :

```
dim={8000.,8000.,8000.,8000.,64000.,59000.,1.144*10^6,
     1.144*10^6,2000.,2000.};
```

Parameters :

```
h0=400.       (* trench depth in nm *)
stpcov=0.5    (* step coverage 50% *)
delta=40.;    (* thermal oxide thickness in nm in trench bottom *)
```

Table of index for outside trench "pos=1" or inside trench "pos=2" measurement position :

```
pos=Round[Abs[mj[[2]]]-.5]+.5];
```

Table form of thickness removed "tr" sorted out by outside trench "tr[[1]]" & inside trench "tr[[2]]" data, and by "fd" feature dimension "tr[[ n,fd ]]", contains "far" feature aspect ratio :

```
dm = Union[dim]
tr=Table[Table[{},{j,Length[ dm ]}],{i,2}]
Do[{
offset = mj[[ 1,after[[1,i]] ]],
sign   = mj[[ 2,after[[1,i]] ]],
di = (Round[sign]+1)*offset/2,
dimen  = dim[[ after[[1,i]] ]],
AppendTo[ tr[[ pos[[ after[[1,i]] ]] ,
                           Flatten[Position[dm,dimen]][[1]] ]],
{( h0 + sign*( after[[ 2,i ]] - after[[ 2,i+offset ]] ) )/
( dimen - 2.*stpcov*(before[[2,i+di]]-delta) ) , r[[2,i]] }]
},{i,Length[before[[1]] ]} ]
ClearAll[dimen,di,dimen,sign,offset];
```

☐ Save arrays here :

```
N[ScientificForm[tr[[1]]],4]

tr={{},{}};
``` tr[[1]]={{{0.3105, -111.6}, {0.219, -5.05}, {0.2219, -4.81},
    {0.2153, 5.98}, {0.2288, -8.45}, {0.2383, 0.34}, {0.2224, 0.58},
    {0.2235, -2.7}, {0.2136, 6.26}, {0.2204, 0.87}, {0.2257, 6.46},
N[ScientificForm[tr[[2]]],4]
tr[[2]]={{{0.3105, 36.12}, {0.219, 28.57}, {0.2219, 31.31},
    {0.2153, 26.93}, {0.2288, 35.58}, {0.2383, 30.63},
    {0.2224, 28.74}, {0.2235, 29.32}, {0.2136, 29.65},
■ Plots of thickness removed vs feature aspect ratio :
<<:Graphics:Graphics.m
in2m = ListPlot[tr[[2,1]]]
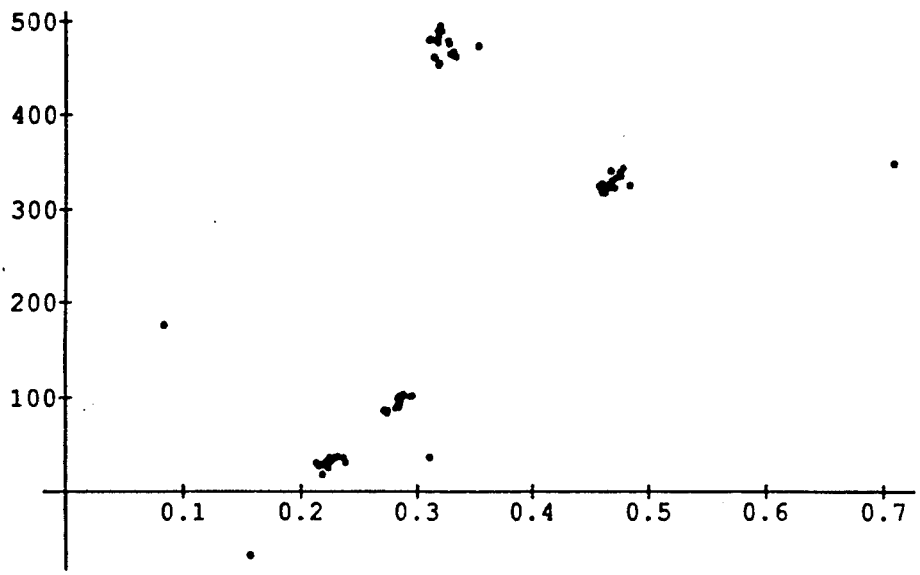
-Graphics-
in8m = ListPlot[tr[[2,2]]]
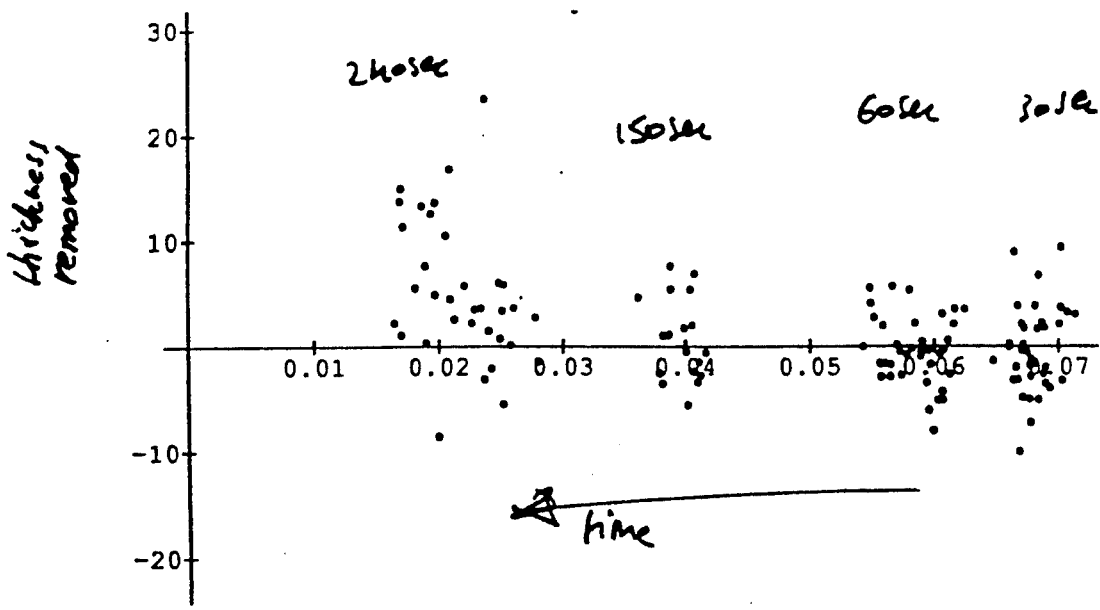

-Graphics-
in59m = ListPlot[tr[[2,3]]]
BEST AVAILABLE COPY
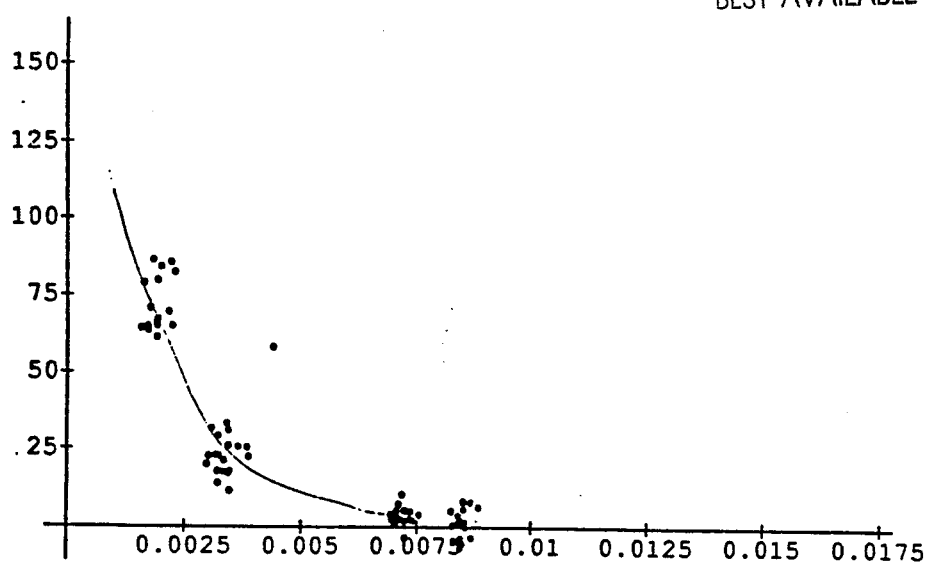
-Graphics-
in64m = ListPlot[tr[[2,4]]]
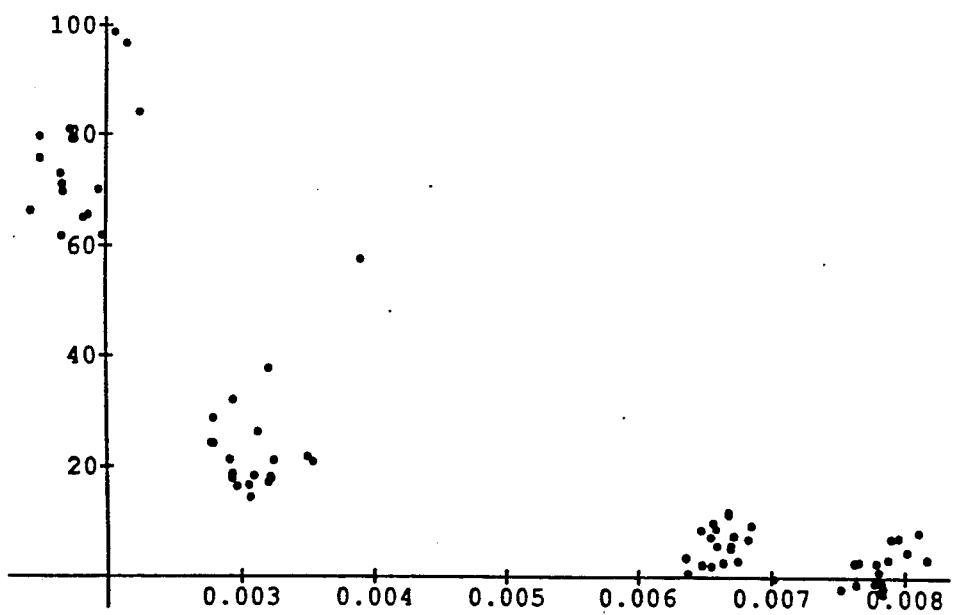
-Graphics-
ininfm= ListPlot[tr[[2,5]]]

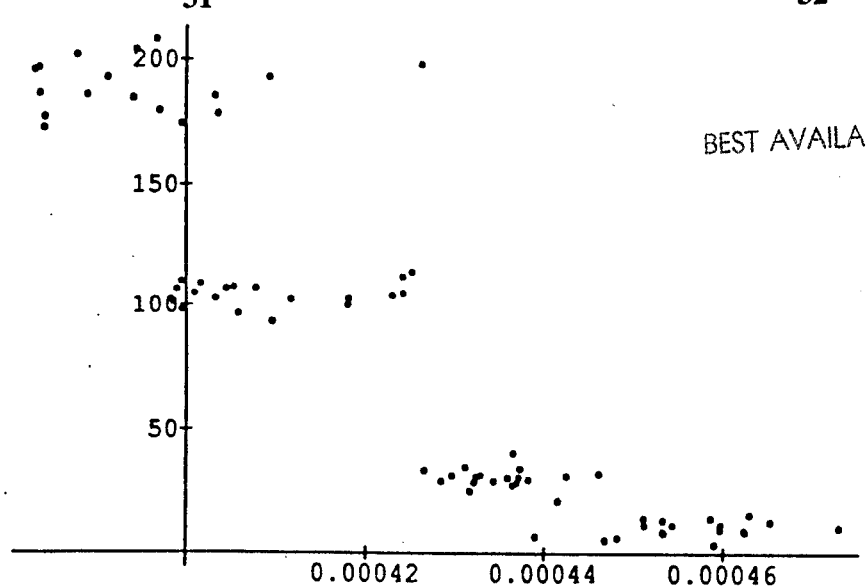
BEST AVAILABLE COPY
-Graphics-
*In[34]:=*
```
out2m = ListPlot[tr[[1,1]]]
```
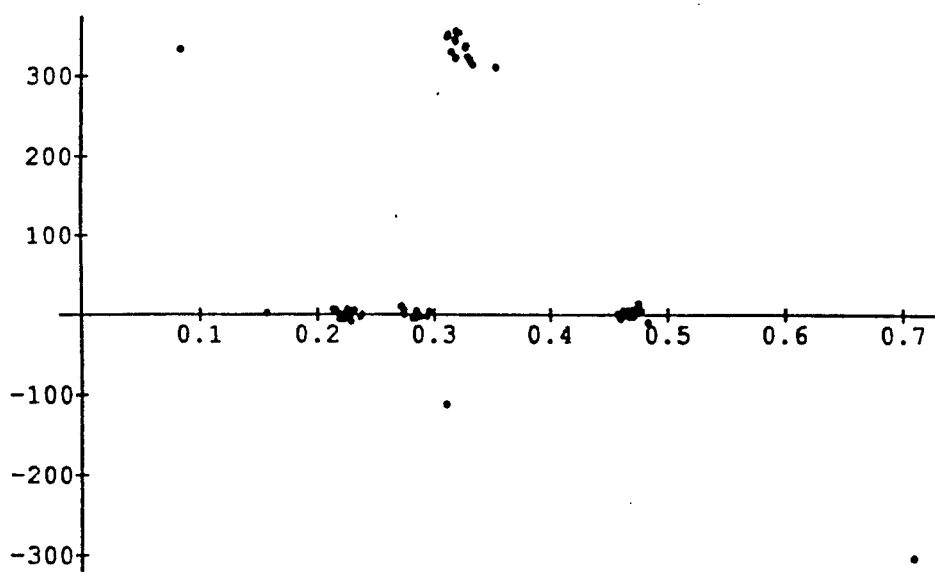
*Out[34]=*
   -Graphics-

*In[35]:=*
    out8m = ListPlot[tr[[1,2]]]
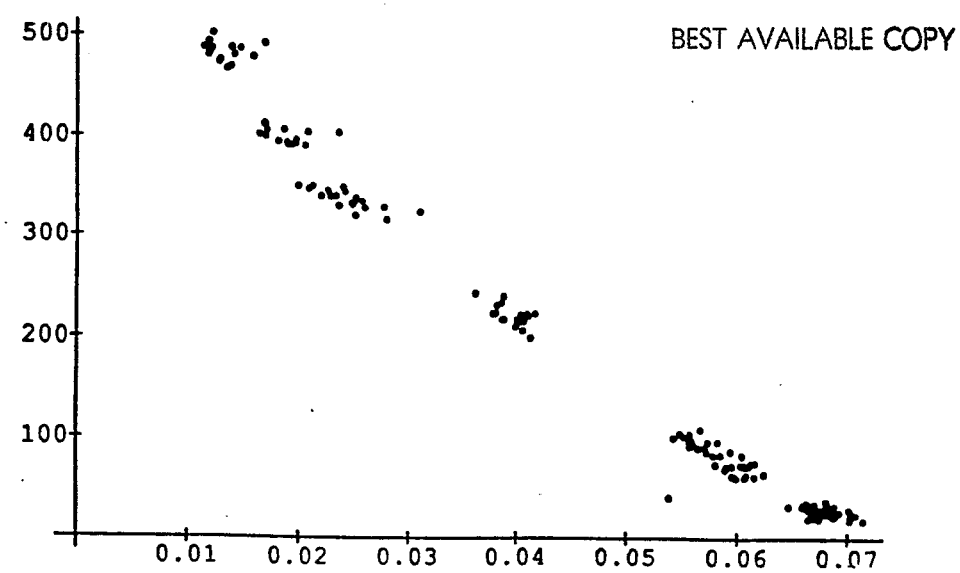
BEST AVAILABLE COPY
*Out[35]=*
    -Graphics-
*In[38]:=*
    outinfm = ListPlot[tr[[1,5]]]
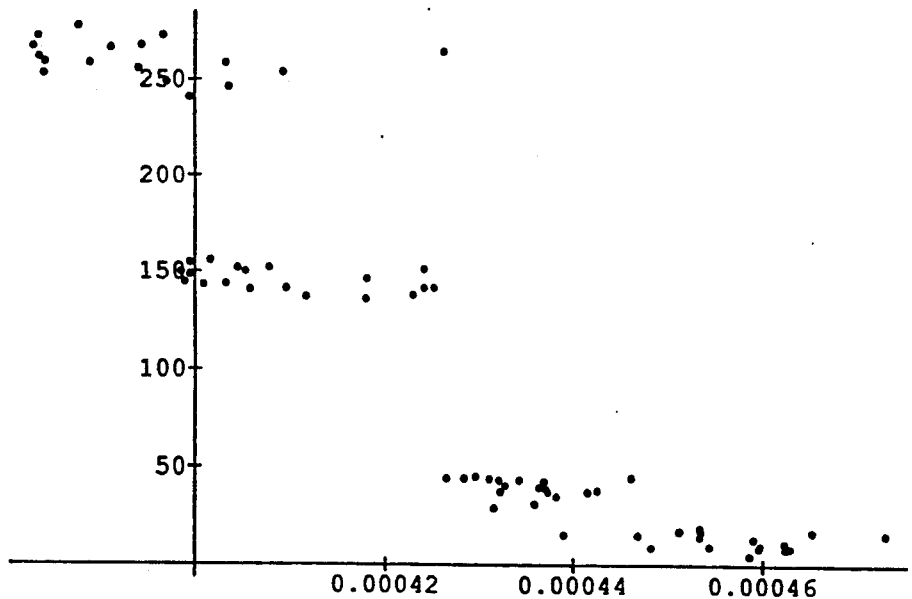
*Out[38]=*
    -Graphics-

Polishing planarization

*by Philippe Schoenborn  
with Nick Pasch  
August 9, 1990*

BEST AVAILABLE COPY

Section 1, theory

Section 2, experimental  
LXA0026 mask

■ Import data :
!! delete data lines with "aln err" messages in them, in all data files.
Make sure data files of same wafer have matching measurement positions.
Make sure data group inside/outside trench are complete
Check & update groups of cells headed by a $\Omega$ !!

☐ Identify # of wafers, polish times in sec. & data files :

Read data files :

■ Prepare arrays :

☐ Save arrays here :

■ Plots of thickness removed vs feature aspect ratio :

■ Fit and analysis of data :

```
dm={2000.,8000.,59000.,64000.,1.144*10^6}
trsurf=Table[Table[{},{j,Length[ dm ]}],{i,2}]
Table[AppendTo[trsurf[[i,j]],Flatten[{dm[[j]],tr[[i,j,k]]}],1]],
          {i,2},{j,5},{k,Length[tr[[i,j]]]} ];
```

☐ Outside trench area "trfo" is the function of thickness removed versus x=feature dimension and y=feature aspect ratio :

```
trf=Fit[Flatten[{trsurf[[1,2]],trsurf[[1,5]]},1],
                                      {1,x,y,x*y},{x,y}]
``` trfo=540.200031552937517 + 0.000921658560256191641*x + 16702.89066953553912*y − 3.068679893372100446*x*y ;

Show[%21,%64]

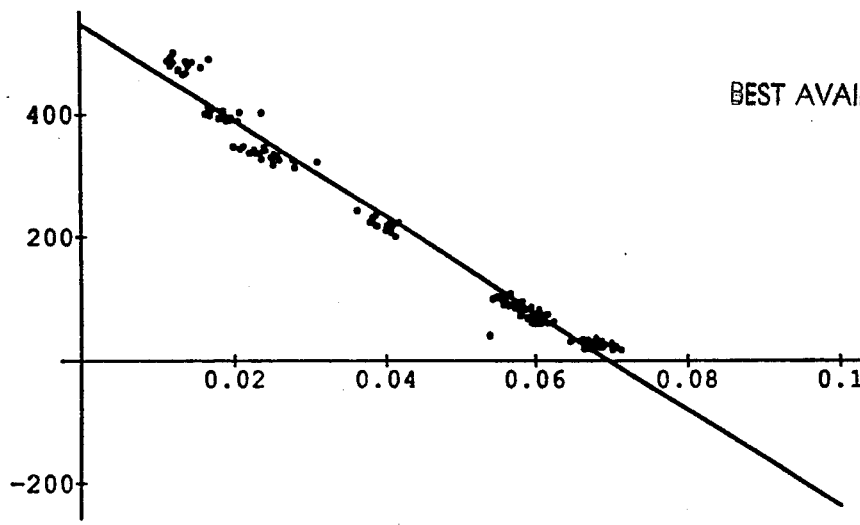

Show[%54,%66]

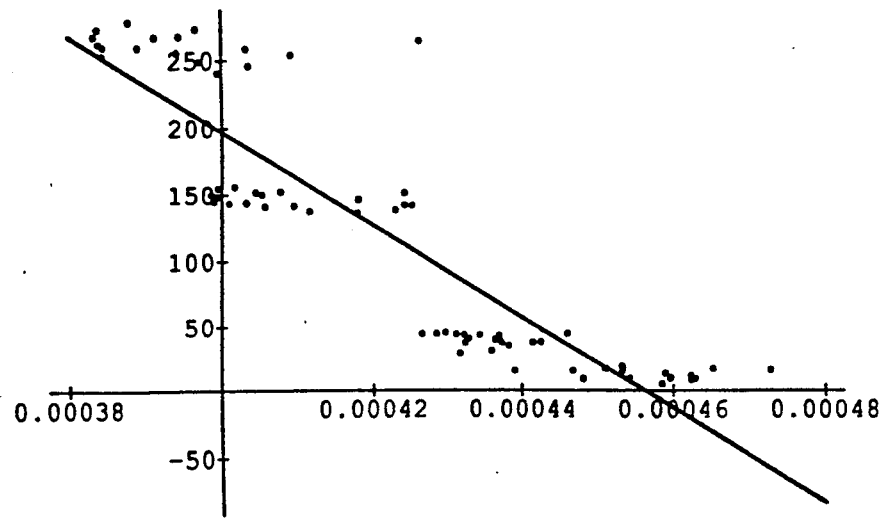

☐ Inside trench area "trfi" is the function of thickness removed versus x=feature dimension and y=feature aspect ratio :

In[12]:=
```
dm={2000.,8000.,59000.,64000.,1.144*10^6}
logtr=Table[Table[{},{j,Length[ dm ]}],{i,2}]
Table[ AppendTo[ logtr[[i,j]] ,
        Flatten[{tr[[i,j,k,1]],Log[Abs[tr[[i,j,k,2]]]]}],1] ],
              {i,2},{j,5},{k,Length[tr[[i,j]]]}];
```

The second element of the list is being dropped off as it is an outlier, this improves the fit significantly :

In[20]:=
```
Fit[Drop[logtr[[2,3]],{2,2}],{1,x},x]
```

Out[20]=
    4.99995 - 497.905 x

*In[22]:=*
   Show[%,%13]
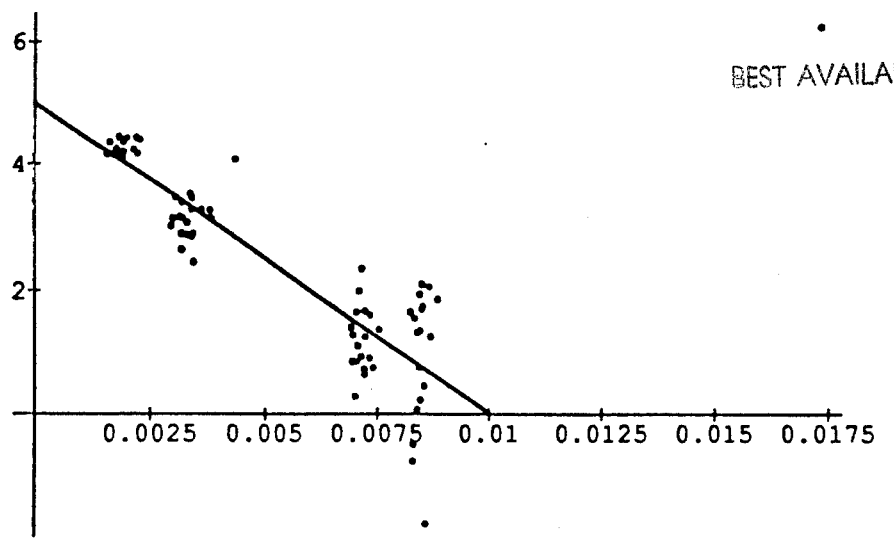
*In[23]:=*
   Fit[logtr[[2,4]],{1,x},x]
*Out[23]=*
   5.00033 - 533.544 x
*In[26]:=*
   Show[%,%24]
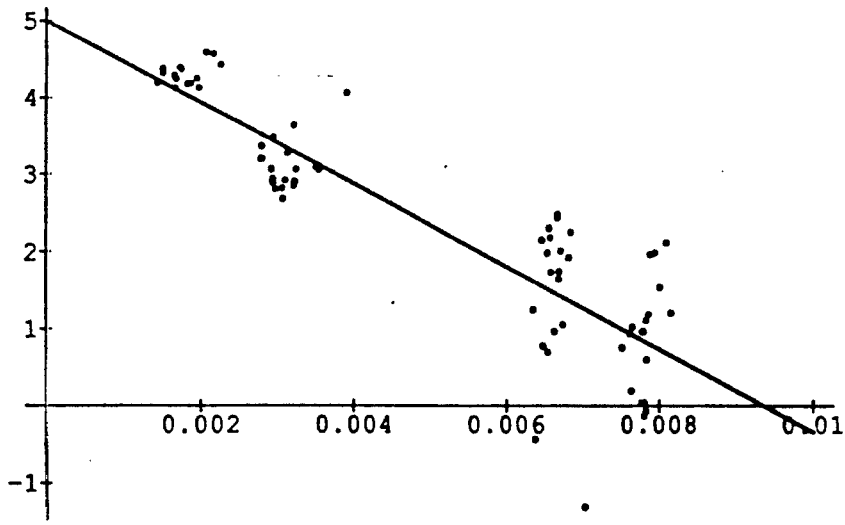
*In[27]:=*
   Fit[logtr[[2,2]],{1,x},x]
*Out[27]=*
   2.8648 - 36.2414 x

*In[33]:=*
   Show[%32,%29]
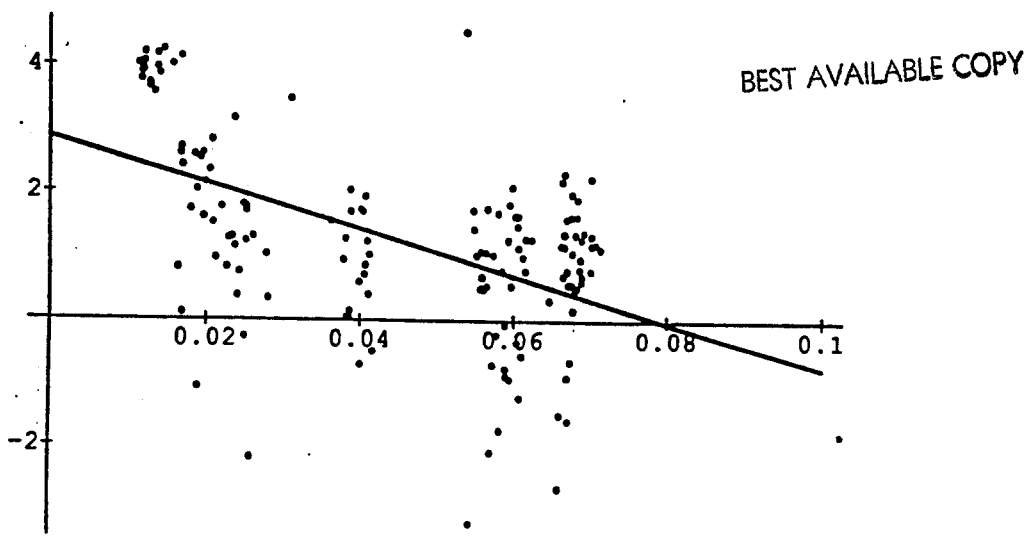
BEST AVAILABLE COPY
*In[34]:=*
   Fit[logtr[[2,5]],{1,x},x]
*Out[34]=*
   22.0856 - 42938.3 x
*In[37]:=*
   Show[%,%35]
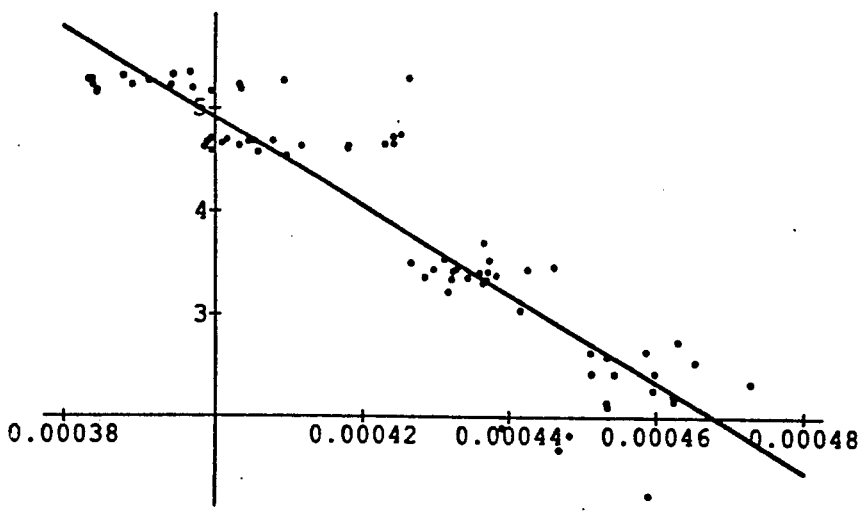
The log of the slope looks linear in the log of the dimension :
lgslope=Log[{{59000.,497.905},{64000.,533.544},{8000.,36.2414},
{1.144*10^6,42938.3}}]
{{10.9853, 6.21041}, {11.0666, 6.27954}, {8.9872, 3.5902},
  {13.95, 10.6675}}
Fit[lgslope,{1,x},x]
-9.4512 + 1.43484 x Show[%,%9]

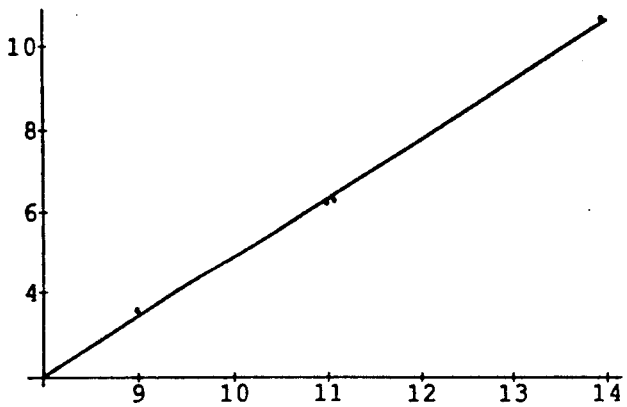

The offset looks linear in the square root of the dimension :

sqofst={{242.9,5.},{253.,5.},{89.44,2.8648},
{1069.6,22.0856}}

{{242.9, 5.}, {253., 5.}, {89.44, 2.8648}, {1069.6, 22.0856}}

Fit[sqofst,{1,x},x]

0.398877 + 0.0201547 x

Show[%,%19]

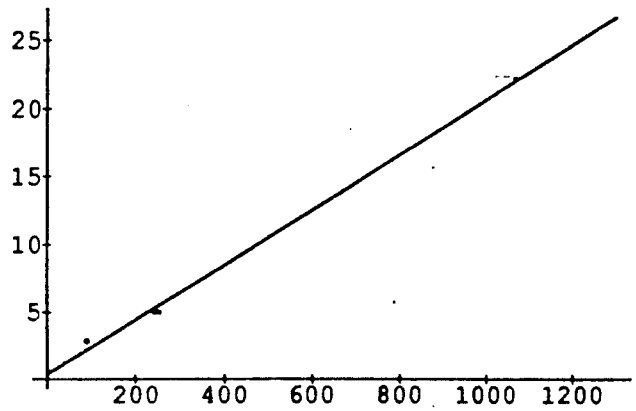

Section 4, final models :

Analytical function of thickness removed inside trench "trfi" and outside trench "trfo" as a function of trench dimension "d" and feature aspect ratio "f" :

trfo[d_,f_]:= c1 + c2*d + c3*f +c4*d*f
trfi[d_,f_]:=Exp[offset[d]+slope[d]*f]
offset[d_]:=a+b*Sqrt[d]
slope[d_]:=-Exp[c]*d^q ;

☐ Relative polish rate :

rp[x_,y_]=Factor[ (D[trfi[x,y],x]+D[trfi[x,y],y]) /
         (D[trfo[x,y],x]+D[trfo[x,y],y])            ] ;

rp[x_,y_]:=-(E^(a + b*x^(1/2) - E^c*x^q*y)*
    (-(b*x^(1/2)) + 2*E^c*x^(1 + q) + 2*E^c*q*x^q*y))/
    (2*x*(c2 + c3 + c4*x + c4*y))

rp[d,f]

$$-(E^{a + b\,\text{Sqrt}[d] - E^{c}\,d^{q}\,f}\,(-(b\,\text{Sqrt}[d]) + 2\,E^{c}\,d^{1+q}\,f +$$
$$2\,E^{c}\,d^{q}\,f\,q))\,/\,(2\,d\,(c2 + c3 + c4\,d + c4\,f))$$
Parameters :
```
a  = 0.3988773430621135817
b  = 0.02015474314945046085
c  = -9.451197856353703481
q  = 1.434844536539095357
c1 = 540.200031552937517
c2 = 0.0009216585602561916417
c3 = 16702.89066953553912
c4 = -3.068679893372100446 ;
ClearAll[a,b,c,q,c1,c2,c3,c4]
Timing[
Plot3D[rp[10^d,10^f],{f,-3.5,-2.},{d,4.,6.},
Shading->False,BoxRatios->{1.,1.,.6},PlotRange->{0.,1.},
ViewPoint->{2.4,-1.,2.},PlotPoints->20,ClipFill->{GrayLevel[1]}] ;
]
```
BEST AVAILABLE COPY
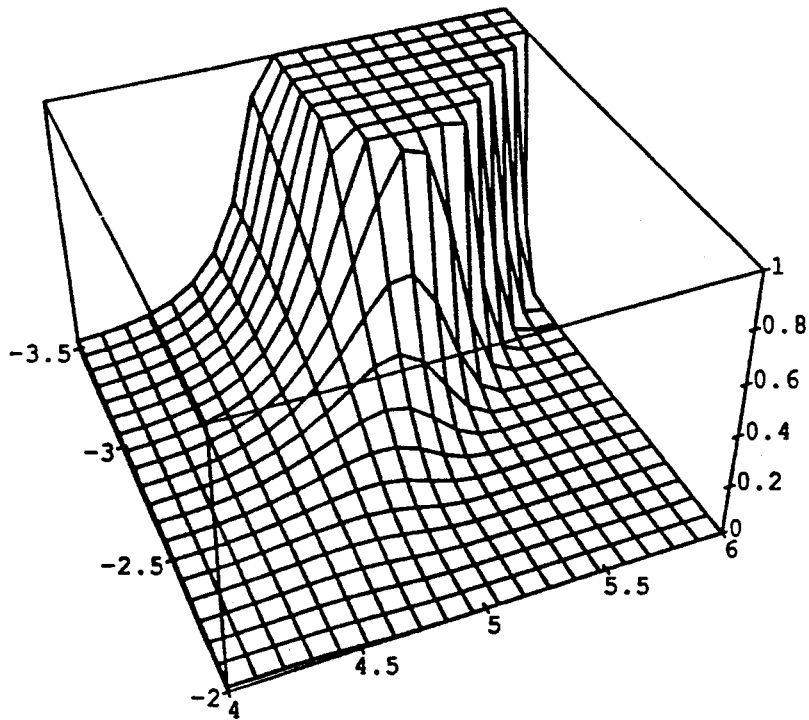

Quality Characteristic for Polishing Planarization

*by Philippe Schoenborn*
*October 19, 1990*

Section 1, theory

A parametric description of LTO-filled shallow trench planarization process by polishing has been established previously. The approach introduced in this notebook aims at providing a unique characteristic that reflects the quality of the process and allows its optimization. The polishing quality-characteristic is such that it ought to be made as large as possible.

The quality-characteristic "Quality" is defined as :

Quality = 20 Log[ b Exp[-(1/2) ((eta-1)/tol)^2 ] / sigma ]

where b is a normalizing parameter such that :

Integral[ b Exp[-(1/2) ((eta-1)/a)^2 ] ,{eta,-Infinity,Infinity} ] = 1

"eta" is a figure of merit defined as :

eta = tin/h (1- tout/tin)

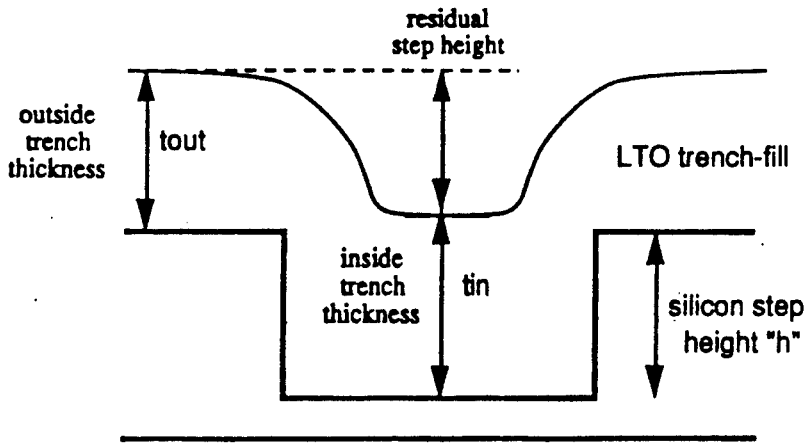

where "h" is the silicon step height, "tin" is the LTO thickness inside the trench and "tout" is the LTO thickness outside that trench at a given time "t" (i.e. tin = tin(t) and tout = tout(t) ). "eta" must be measured at various locations across the wafer and for several trench sizes.

"eta" is such that prior to polishing tin=tout and eta=0, and after polishing is completed tout=0 and eta = tin/h should equal 1 if it was perfectly planarized. In summary, 0 < eta < 1 and "eta" is targeted to be equal to 1.

Polish time is not an independent parameter because it is determined by how long it takes to clear LTO from the island areas all over the wafer with a safe margin (over polish). Hence the entire wafer area is subject to a given polish time even though it may not be appropriate at any given location.

As a result "eta" will take different values across the wafer and will also depend on the trench dimension or shape. This was demonstrated in a previous work.

The question is therefore to find out how "eta" can be made to have a distribution as tight as possible centered around eta=1. That is to make the standard deviation of "eta", defined as sigma as small as possible :

$$\text{target} : \text{eta} \rightarrow 1 \ \& \ \text{sigma} \rightarrow 0$$

In this representation, polish rate non-uniformity is treated as noise and the quality-characteristic reflects the signal to noise ratio with specific targets. The quality-characteristic must then be made as large as possible as a criterion for process optimization.

Finally the parameter "tol" is the tolerance on departure of "eta" from 1. For example if a ±10% variation on "eta" is acceptable then tol=0.03 corresponds to :

$$3 \quad \text{tol} \equiv \pm 1 \ 0 \ \%$$

Notes :
The quality-characteristic accounts for sources of noise foreign to the polishing process itself, such as trench depth non-uniformity unless "h" is measured concurrently with "tin" and "tout".
From this viewpoint a topographic measurement with a profilometer would be preferable. Then "eta" would simply be the residual step height.

Special case :
When there is a trench mask in place the formula for "eta" becomes :

$$\text{eta} = \text{tin/h} \ (1 - \text{tout/(tin+mask)} \ )$$

where "mask" is the mask thickness and "tout" is the total thickness of mask and film outside trench. That way eta=0 at time 0 and eta->tin/h when tout->0.

---

Section 2, experimental
LXA0026 mask

■ Import data :
  !! delete data lines with "aln err" messages in them, in all data files.

Make sure all data files of any given wafer have matching measurement positions.
Make sure data group inside/outside trench are complete
Check & update groups of cells headed by a square !!

□ Identify # of wafers, polish times in sec. & data files :

thickness={} (* contains thickness data *)

(* sort filenames in order of their polish time *)

filename={"SL917.25B","SL917.25A","SL917.10A","SL917.08A",
   "SL917.19A","SL917.24A"}
pt={0.,30.,60.,150.,240.,600.}  (* polish times *)
lf=Length[filename];

Read data files. Puts measurement position followed by thickness in "thickness" array :

Do[{
OpenRead[filename[[i]]],
Read[filename[[i]],{String,String}],
data=ReadList[filename[[i]],{Number,Number,Number,Number,
              Number,Number}],
Close[filename[[i]]],
thickness=AppendTo[thickness,
  Transpose[ Transpose[data] [[ {4,5} ]] ]    ]
},{i,lf}]
ClearAll[data];

MatrixForm[Table[thickness[[1,i]],{i,10}]]

| | |
|---|---|
| 1 | 623.22 |
| 2 | 758.06 |
| 3 | 623.76 |
| 4 | 753.89 |
| 5 | 626.16 |
| 6 | 625.58 |
| 7 | 748.95 |
| 8 | 629.6 |
| 9 | 754.78 |
| 10 | 606.16 |

■ Prepare arrays :

There are 10 measurement sites per die, 6 inside trenches, 5 outside. Let j=1,...,6 be the feature index. Their inside/outside pairs of measurements have been grouped as follows for feature aspect ratio calculation (far). Let k=1,...10 be the measurement no., and i=1,...,19 be the die index.

| j | k | trench size | k | island size | location |
|---|---|---|---|---|---|
| 1 | 1 | 0.008 | 2 | 0.016 | corner array |
| 2 | 3 | 0.008 | 4 | 0.016 | center array |
| 3 | 5 | 0.064 | 2 | 0.016 | between horiz. I/O & array |
| 4 | 6 | 0.059 | 2 | 0.016 | between vert. I/O & array |
| 5 | 8 | 1.144 | 7 | 0.317 | scribe |
| 6 | 9 | 0.002 | 10 | 0.007 | in I/O's |

BEST AVAILABLE COPY (Measurements no. 9 & 10 in and out of the small 2 μm trench will be eliminated from the analysis as it was not possible to achieve reproducible alignment in that trench)

☐ Define format of data file :

Matrix of offsets (first element) & signs (second elements) for inside/outside pairs :

mj={{1,-1,1,-1,-3,-4,1,-1,1,-1},
    {-1.,1.,-1,1.,-1.,-1.,1.,-1.,-1.,1.}};

(* open cell for more details *)

An offset is the relative position of a data point with respect to its "partner". i.e. inside/outside measurements are partners of a pair whose relative position to one another in the lists of data is given by mj[[1]]. A "-1." sign is attributed to an inside trench measurement while a "+1." sign is attributed to an outside measurement.

Table form of thicknesses sorted out by polish time and seperated out by pairs of {inside,outside} measurements :

```
epaisseur = Table[{},{i,Length[ thickness ]}]
Do[{
offset = mj[[ 1,thickness[[i,j,1]] ]],
sign   = mj[[ 2,thickness[[i,j,1]] ]],
If[sign==-1 && thickness[[i,j,1]] != 9,
  (* then *)
   AppendTo[epaisseur[[ i ]],
   {thickness[[i,j,2]],thickness[[i,j+offset,2]]}]
  (* and if *) ]
},{i,Length[thickness]},{j,Length[ thickness[[i]] ]} ]
MatrixForm[Table[epaisseur[[1,i]],{i,10}]]
```

623.22   758.06

623.76   753.89

626.16   758.06

625.58   758.06

629.6    748.95

☐ Save "epaisseur" table here :

Parameters :

h0=400.   (* trench depth in nm *)

mask=130. (* LTO trench mask thickness after trench etch in nm *)

Form "eta" table. LTO thickness after trench etch is assumed
to be 130 nm throughout which was estimated from a few measurement
taken after trench etch :

```
thicktable={}
Table[ AppendTo[thicktable,Transpose[epaisseur[[t]]] ],
                                    {t,Length[epaisseur]}] ;

eta = Table[
 thicktable[[time,1]] / h0 *
    ( 1. - thicktable[[time,2]] / (thicktable[[time,1]] + mask) ) ,
        {time,Length[thicktable]} ] ;
```

☐ Save "eta" table here :

Form average and standard deviation of "eta" table :

```
<<DescriptiveStatistics.m etastat = Table[
{pt[[time]],Mean[eta[[time]]],StandardDeviation[eta[[time]]]},
        {time,Length[pt]} ]

etastat={{0.,   0.00615315431331026267,  0.01796313920555858487},
   {30.,  0.0513975640065792279,   0.0704983747120548183},
   {60.,  0.1876396213754052221,   0.0660365834244218973},
   {150., 0.5482158978171923728,   0.2289638810976073678},
   {240., 0.7086558486644740726,   0.2848896370814273354},
   {600., 0.5136550512461810386,   0.1956871118545692952}}
```

Section 3, analysis

■ Plot "eta" versus time :

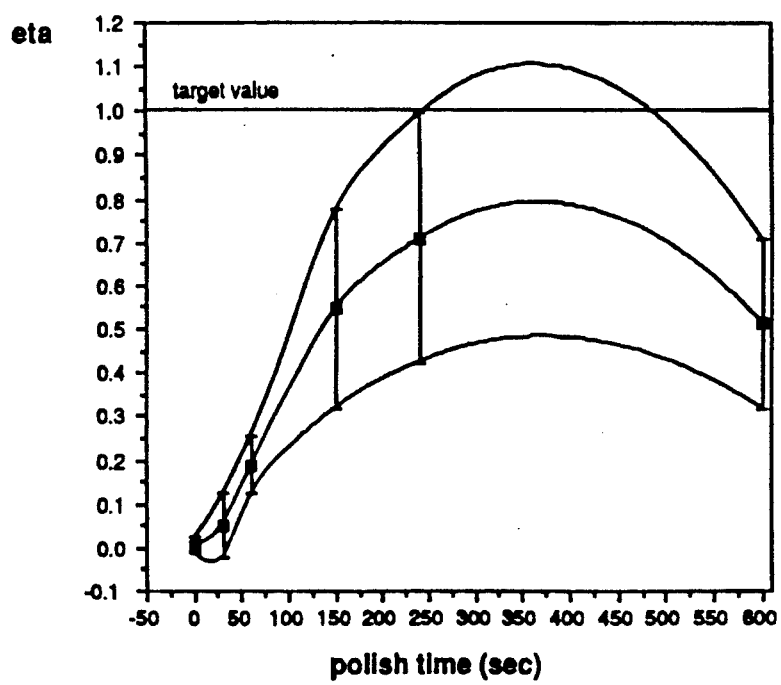

Efficiency of Polishing Process

The figure above shows "eta", the efficiency of the polishing process as a function of polish time. Squares represent the average "eta" for each wafer (polish time) or 152 points measured with the automatic Wild Leitz film thickness measurement system, including 19 measurement locations evenly distributed over the wafer and 3 different trench sizes per location (8μm, 60μm, 1 mm).

For each wafer (time) error bars of one standard deviation are shown with their envelope. The target is to have the average "eta" equal to 1 and as small a standard deviation as possible. It can be observed that the standard deviation increases with polish time until material is removed from outside trenches at which point "eta" is reduced to tin/h where "tin" is the only source of noise.

Section 4, Quality Characteristic

```
etaverage = Transpose[etastat][[2]]
etastddev = Transpose[etastat][[3]]
tol = 0.03
b = N[1./(tol*Sqrt[2.*Pi])]
Quality = {pt,
    20*Log[ b*Exp[-.5*((etaverage-1.)/tol)^2 ] / etastddev ]}
```

The following plot shows the quality characteristic of the polishing process. It ought to be made as large as possible and it can be observed that it reaches a maximum between 240 and 325 sec which corresponds to endpoint time on nitride (note that the wafers used in this study had an LTO trench mask instead of a nitride mask)

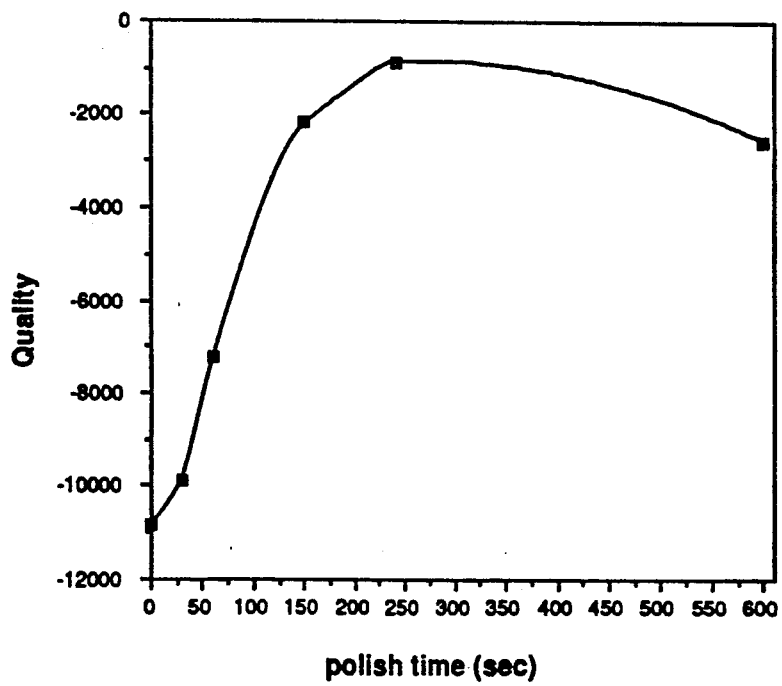

Polishing Quality Characteristic

What is claimed is:

1. A method of planarizing over-filled trenches in a semiconductor device, consisting essentially of:

forming a trench in a substrate by applying a patterned mask layer of nitride on a surface of the substrate and etching the trench through openings in the mask layer, said trench having a relatively large width dimension;

over-filling the trench and mask layer with low-temperature-oxide (LTO) trench-fill material, said trench-fill material exhibiting a trough above the trench, the trough being narrower than the trench and generally centered above the trench;

applying a cap layer of nitride over the LTO trench-fill material at least in the trough;

said cap layer and said mask layer being substantially harder than the trench-fill material, vis-a-vis chemical-mechanical polishing;

a portion of said cap layer material in the trough being substantially coplanar with the mask layer and generally centered above the trench;

chemical-mechanical polishing the trench-fill material and the cap layer material until the nitride mask layer and the coplanar portion of the cap layer are exposed; and subsequently stripping away the mask layer and the portion of the cap layer;

whereby the portion of the cap layer overlying the trench fill material in the trench and substantially at the level of the mask layer causes the relatively wide trench to behave effectively as two smaller (narrower) trenches during the polishing process.

2. A method according to claim 1, wherein:
   the cap layer is applied as a blanket layer over the trench-fill material.

3. A method according to claim 1, wherein:
   the cap layer is selectively applied into the trough.

4. A method according to claim 1, wherein:
   the semiconductor device is contained on a die on a wafer having several dies separated by scribe lines; and
   each semiconductor device has a plurality of trenches covered by trench-fill material having a plurality of troughs.

5. A method according to claim 4, wherein:
   test structures of overfilled trenches are formed in the scribe lines.

6. A method according to claim 4, wherein:
   the plurality of trenches in each semiconductor device are or various widths over a substantial range of widths.

7. Method according to claim 6, wherein:
   the trench has a depth on the order of 4000 Angstroms; and
   the thickness of the trench-fill material is on the order of 4500 Angstroms.

8. Method according to claim 7, wherein:
   the cap layer has a thickness on the order of 500 Angstroms.

9. Method according to claim 7, wherein:
   the thickness of the mask layer is on the order of 1800 Angstroms prior to trench etch and on the order of 1300 Angstroms after trench etch.

* * * * *